(12) United States Patent
Tanaka

(10) Patent No.: US 8,790,852 B2
(45) Date of Patent: Jul. 29, 2014

(54) COLORED COMPOSITION FOR LIGHT-SHIELDING FILM, LIGHT-SHIELDING PATTERN, METHOD FOR FORMING THE SAME, SOLID-STATE IMAGE SENSING DEVICE, AND METHOD FOR PRODUCING THE SAME

(75) Inventor: Tatsuya Tanaka, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 273 days.

(21) Appl. No.: 13/382,452

(22) PCT Filed: Jul. 7, 2010

(86) PCT No.: PCT/JP2010/061857
§ 371 (c)(1),
(2), (4) Date: Jan. 5, 2012

(87) PCT Pub. No.: WO2011/004908
PCT Pub. Date: Jan. 13, 2011

(65) Prior Publication Data
US 2012/0104529 A1 May 3, 2012

(30) Foreign Application Priority Data

Jul. 7, 2009 (JP) .................................. 2009-160703
Aug. 12, 2009 (JP) .................................. 2009-187166

(51) Int. Cl.
*G02B 5/20* (2006.01)
(52) U.S. Cl.
USPC ................................ 430/7; 430/321; 257/432
(58) Field of Classification Search
None
See application file for complete search history.

(56) References Cited

U.S. PATENT DOCUMENTS

| 5,880,202 A | 3/1999 | Yamashita et al. |
| 2002/0047108 A1 | 4/2002 | Yukinobu et al. |
| 2010/0243970 A1 | 9/2010 | Toshimitsu et al. |
| 2010/0247752 A1 | 9/2010 | Hayashi et al. |

FOREIGN PATENT DOCUMENTS

| JP | 09-054431 A | 2/1997 |
| JP | 10-001626 A | 1/1998 |
| JP | 10-246955 A | 9/1998 |
| JP | 2003344636 A | 12/2003 |
| JP | 3724269 B2 | 12/2005 |
| JP | 2006-182627 A | 7/2006 |
| JP | 2006-206891 A | 8/2006 |
| JP | 2006-209102 A | 8/2006 |

(Continued)

OTHER PUBLICATIONS

Computer-generated translation of JP 09-054431 (Feb. 1997).*

(Continued)

*Primary Examiner* — John A. McPherson
(74) *Attorney, Agent, or Firm* — Sughrue Mion, PLLC

(57) ABSTRACT

The present invention provides a colored composition for a light-shielding film including at least one selected from titanium atom-containing black titanium pigments and at least one organic pigment selected from the group consisting of a red organic pigment, a yellow organic pigment, a violet organic pigment, and an orange color organic pigment, which has a maximum value of the transmittance of light having a wavelength of 400 to 700 nm of 1.5% or less when a film is formed such that the light transmittance at a wavelength of 650 nm is 0.2%, has a wavelength showing the maximum transmittance at 400 to 550 nm, and has a light transmittance at a wavelength of 400 nm of 0.1% or more.

21 Claims, 2 Drawing Sheets

(56) References Cited

FOREIGN PATENT DOCUMENTS

| JP | 2007-033467 A | * | 2/2007 |
|---|---|---|---|
| JP | 2007121560 A | | 5/2007 |
| JP | 2009069822 A | | 4/2009 |
| WO | WO 2005/037926 A1 | | 4/2005 |

OTHER PUBLICATIONS

Computer-generated translation of JP 2007-033467 (Feb. 2007).*
First Office Action, dated Jul. 26, 2013, issued in corresponding CN Application No. 201080029240.4, 15 pages in English and Chinese.
Communication, dated Mar. 27, 2013, issued in corresponding EP Application No. 10797216.8, 6 pages.
Office Action dated Jan. 16, 2014 in corresponding Chinese Application No. 201080029240.4.
Notice of Reasons for Rejection, dated Nov. 5, 2013, issued in corresponding JP Application No. 2012-154894, 4 pages in English and Japanese.
Notice of Reasons for Rejection, dated Sep. 24, 2013, issued in corresponding JP Application No. 2010-153323, 4 pages in English and Japanese.

* cited by examiner

COLORED COMPOSITION FOR LIGHT-SHIELDING FILM, LIGHT-SHIELDING PATTERN, METHOD FOR FORMING THE SAME, SOLID-STATE IMAGE SENSING DEVICE, AND METHOD FOR PRODUCING THE SAME

TECHNICAL FIELD

The present invention relates to a colored composition for a light-shielding film using a titanium atom (Ti)-containing black pigment such as black titanium and the like, a light-shielding pattern, a method for forming the same, a solid-state image sensing device, and a method for producing the same.

BACKGROUND ART

A color filter used in the liquid crystal display device is provided with a light-shielding film known as a black matrix for the purpose of improving the contrast by shielding light between colored pixels, or the like. Furthermore, in a solid-state image sensing device, a light-shielding filter film is provided for the purpose of preventing generation of noise due to shielding light on the back side or shielding light in the infrared region between pixels, improving image quality, or the like.

As a composition for forming a black matrix for a liquid crystal display device or a light-shielding filter film (light-shielding film) used in a solid-state image sensing device, a photosensitive resin composition containing a black coloring material such as carbon black, black titanium, and the like is known.

Specifically, for example, there have been suggested a photosensitive resin composition containing a black titanium, which has a specific X-ray diffraction peak intensity ratio for improvement of an optical density or the like (see, for example, Japanese Patent No. 3724269 and the pamphlet of International Publication No. 2005/037926), and a photosensitive resin composition containing a black titanium, which has a specific nitrogen concentration or a specific crystallite diameter (see, for example, Japanese Patent Application Laid-Open (JP-A) No. 2006-182627, JP-A No. 2006-206891, and JP-A No. 2006-209102) as a photosensitive resin composition. Further, as the light-shielding materials, there have been disclosed a pigment-dispersed composition containing a pigment mixture composed of an organic pigment and a titanium oxide pigment, and/or titanium oxynitride (see, for example, JP-A No. 10-1626).

Further, in the solid-state image sensing device, above a microlens disposed on a color filter and a light-receiving element for receiving light via the color filter, a light-transmitting optical member having a light-shielding section for reduction in the amount of light incident on the device, control of the optical path, or the like is generally disposed. In such an optical member, a light-shielding section is formed and the light-shielding section is formed, for example, by vapor-depositing a metal film in a region other than a light-transmitting section, forming a black film using a resist material including a black agent such as carbon black and the like, etc.

Conventionally, a film containing carbon black has been widely used since it can provide high light-shielding concentrations across a wide range of the wavelength regions. The optical density of the film containing carbon black increases gradually from a long-wavelength side to a short-wavelength side, and accordingly, the optical density in a short-wavelength region is extremely high, as compared with the long-wavelength side. As a result, there is a tendency that upon pattern exposure with light in the ultraviolet region such as, for example, a g-ray, an h-ray, an i-ray, and the like at a time of preparation, light does not reach the inside of the film, and exposure is insufficient, thereby easily leading to deterioration of the pattern shape or peeling.

Titanium black has a light-shielding property for shielding long-wavelength light in the infrared region or the like, but can transmit light on a short-wavelength side. As a result, pattern exposure can be carried out well with light in the ultraviolet region. However, in fact, regarding a color colored black with titanium-containing black pigment, its transmittance region also encompasses the visible region (400 to 700 nm). Thus, the light-shielding property in the visible region is easily reduced, as compared with widely used carbon black, and the transmitted light may be noise on a device in some cases.

Furthermore, if a film is formed by vapor deposition, there is a problem that the film surface is warped due to shrinkage and thus easily causes poor adhesion, in addition to a problem that the step is complicated. Further, the vapor-deposited film has a light reflecting property, which may cause concern about its side effects.

On the other hand, recently, size reduction of the solid-state image sensing device has been particularly promoted. In the color filter for a solid-state image sensing device, there is a demand for a thinner layer (for example, a thickness of 1 μm or less) of a colored pattern, and there is also a demand for technology corresponding to a thinner film for a light-shielding film.

DISCLOSURE OF INVENTION

The present invention has been made in view of the above circumstances, and provides a colored composition for a light-shielding film, a light-shielding pattern, a method for forming the same, a solid-state image sensing device, and a method for producing the same.

The invention is accomplished on the basis of knowledge that pattern formability and an adhesion property can be enhanced by selectively lowering the transmittance in the visible region in the composition containing a black titanium pigment in order to have superior light-shielding capability in a wide-wavelength region and also to maintain the transmittance of light (i-ray or the like) in a short-wavelength region at less than 400 nm as in a light-shielding film employing carbon black.

According to a first aspect of the invention, there is provided a colored composition for a light-shielding film including at least one pigment selected from titanium atom-containing black titanium pigments and at least one organic pigment selected from the group including a red organic pigment, a yellow organic pigment, a violet organic pigment, and an orange color organic pigment, wherein the colored composition has a maximum value of the transmittance of light having a wavelength of 400 to 700 nm of 1.5% or less when a film is formed such that the light transmittance at a wavelength of 650 nm is 0.2%, has a wavelength exhibiting a maximum transmittance at 400 to 550 nm, and has a light transmittance at a wavelength of 400 nm of 0.1% or more.

According to a second aspect of the invention, there is provided a method for forming a light-shielding pattern including providing the colored composition for a light-shielding film in the first aspect on a support to form a colored film, exposing the colored film in a pattern shape, and developing the colored film after exposure to form a light-shielding pattern.

According to a third aspect of the invention, there is provided a light-shielding film including at least one pigment selected from titanium atom-containing black titanium pigments and at least one organic pigment selected from the group consisting of a red organic pigment, a yellow organic pigment, a violet organic pigment, and an orange color organic pigment, wherein the light-shielding film has a maximum value of the transmittance of light having a wavelength of 400 to 700 nm of 1.5% or less when the light transmittance of light having a wavelength of 650 nm is 0.2%, has a wavelength exhibiting a maximum transmittance at 400 to 550 nm, and has a light transmittance at a wavelength of 400 nm of 0.1% or more.

According to a fourth aspect of the invention, there is provided a light-shielding film formed by the method for forming a light-shielding pattern in the second aspect.

According to a fifth aspect of the invention, there is provided a method for producing a solid-state image sensing device including providing the colored composition for a light-shielding film in the first aspect on the light-transmitting member disposed on a light-receiving surface side of a semiconductor substrate provided with at least a color filter and a light-receiving region to form a colored film, exposing the formed colored film in a pattern shape, developing the colored film after exposure to form a light-shielding pattern, and separating the semiconductor substrate after formation of the light-shielding pattern into predetermined element to prepare a solid-state image sensing device.

According to a sixth aspect of the invention, there is provided a solid-state image sensing device including a semiconductor substrate including plural light-receiving elements, an optical member which is disposed facing each light-receiving element and has a light-collecting function for collecting light incident on the light-receiving elements, a color filter which is disposed between the light-receiving element and the optical member, and a light-transmitting member which is provided on the side of the optical member not facing the color filter, has a light-shielding pattern in at least a part of the regions other than the region facing the plurality of light-receiving elements, the light-shielding pattern comprising at least one pigment selected from titanium atom-containing black titanium pigments and at least one organic pigment selected from a red organic pigment, a yellow organic pigment, a violet organic pigment, and an orange color organic pigment, wherein the light-shielding pattern has a maximum value of the transmittance of light having a wavelength of 400 to 700 nm of 1.5% or less when the light transmittance of light having a wavelength of 650 nm is 0.2%, has the wavelength exhibiting the maximum transmittance at from 400 to 550 nm, and has the light transmittance at a wavelength of 400 nm of 0.1% or more.

According to a seventh aspect of the invention, there is provided a solid-state image sensing device including the light-shielding film in the third aspect or the fourth aspect.

BRIEF DESCRIPTION OF DRAWINGS

Exemplary embodiments of the present invention will be described in detail based on the following figures, wherein.

BEST MODE FOR CARRYING OUT THE INVENTION

Figure 1:
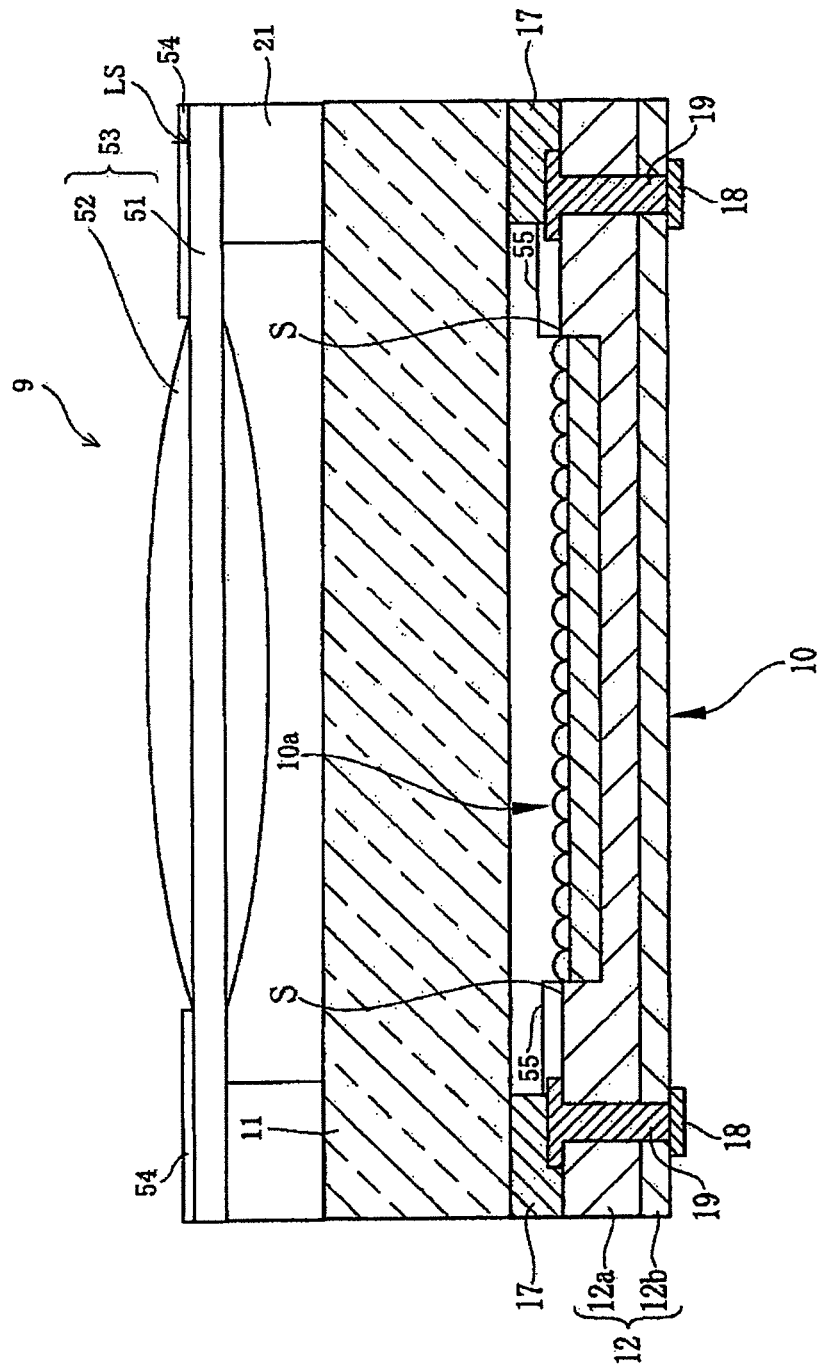
FIG. 1 is a schematic cross-sectional view showing a constitutional example of the solid-state image sensing device.

Hereinafter, the colored composition for a light-shielding film, the light-shielding pattern, the method for forming the same, the solid-state image sensing device, and the method for producing the same of the present invention will be described in detail.

<Colored Composition for Light-Shielding Film>

The colored composition for a light-shielding film of the invention is configured to include a titanium atom-containing black titanium pigment, and at least one organic pigment selected from a red organic pigment, a yellow organic pigment, a violet organic pigment, and an orange color organic pigment, have a maximum value of the transmittance of light having a wavelength of 400 to 700 nm of 1.5% or less when a film is formed such that the light transmittance at a wavelength of 650 nm is 0.2%, have a wavelength exhibiting the maximum transmittance at 400 to 550 nm, and have a light transmittance at a wavelength of 400 nm of 0.1% or more.

In the first embodiment of the invention, predetermined light transmittance characteristics which had been impossible to be attain in conventional composition systems such as carbon black and black titanium are realized by combination of a black titanium pigment and organic pigments selected from a red organic pigment, a yellow organic pigment, a violet organic pigment, and an orange color organic pigment as a coloring material. In this regard, the invention according to the first embodiment can attain a colored pattern which has light-shielding capability required for prevention of noise, is precise, and inhibits peeling. Since it does not depend on vapor deposition, peeling of the film surface due to bending does not occur.

Thus, it is possible to provide a color filter as well as a solid-state image sensing device, each of which has little noise and is excellent in color reproducibility.

Further, it is possible to inhibit the enlargement of the pattern shape due to light diffusion upon exposure and the reversed-tapering in which the pattern cross-section becomes thinner as it approaches the substrate, by controlling the transmittance in the wavelength region of light upon exposure.

That is to say, a black titanium pigment can have light to be transmitted in a low-wavelength side including the light wavelength which is capable of shielding light in the infrared region and used for exposure, and whose range reaches the visible region (particularly 400 to 700 nm). For this reason, in order to shield light selectively in the infrared region and the visible region requiring light-shielding, an organic pigment selected from a red organic pigment, a yellow organic pigment, a violet organic pigment, and an orange color organic pigment is used instead of carbon black or the like which exhibits too high a light-shielding capability in a short-wavelength region. Specifically, a predetermined black density required for light-shielding in a wide-wavelength region (for example, an optical density (OD) of 3 or more) can be secured by allowing the composition to have a maximum value of the transmittance of light having a wavelength of 400 to 700 nm of 1.5% or less when a film is formed such that the light transmittance at a wavelength of 650 nm is 0.2%, have a wavelength showing the maximum transmittance at 400 to 550 nm, and have a light transmittance at a wavelength of 400 nm of 0.1% or more.

Furthermore, the optical density (OD) is given as an OD value by carrying out measurement of the transmittance of the obtained film using UV-3600 manufactured by Shimadzu Corporation, and converting the obtained transmittance (% T) according to the following formula.

$$\text{OD Value} = -\text{Log}(\% T/100)$$

In the invention, from the viewpoint of increasing the required light-shielding capability and the effect of prevention of pattern peeling, the maximum value of the light transmittance at a wavelength of 400 to 700 nm is 1.5% or less (preferably from 0.01 to 1.0%) when a film is formed such that the light transmittance at a wavelength of 650 nm is 0.2%, the wavelength showing the maximum transmittance is from 400 to 550 nm (preferably from 400 to 460 nm), and the light transmittance at a wavelength of 400 nm is 0.1% or more (preferably from 0.35 to 1.0%).

Examples of the method for adjusting the light transmittance to the above-described range include (1) a method for adjusting the mixing ratios of a black titanium pigment and organic pigments selected from a red organic pigment, a yellow organic pigment, a violet organic pigment, and an orange color organic pigment, (2) a method for selecting the kinds of the organic pigments, if desired, and other methods.

Specifically, the mixing ratio of the black titanium pigment and the organic pigment can be adjusted to the above-described transmittance by mixing the organic pigment (orp) and the black titanium pigment (tip) so as to satisfy a mass ratio (tip:orp) of 90:10 to 40:60. From the viewpoint of improvement of the effect of a light-shielding property and adhesion property, the mass ratio (tip:orp) is more preferably in the range satisfying from 90:10 to 60:40.

Moreover, a case where the mass ratio (tip:orp) of the black titanium pigment to the red organic pigment and/or the yellow organic pigment satisfies from 90:10 to 40:60 (more preferably from 90:10 to 60:40) is preferable, and a case where the mass ratio (tip:orp) of the black titanium pigment to an organic pigment selected from a diketopyrrolopyrrole-based pigment, a perylene-based pigment, a naphthol AS-based pigment, and an anthraquinone-based pigment satisfies from 90:10 to 40:60 (more preferably from 90:10 to 60:40) is more preferable.

Further, the content of the black titanium pigment in the colored composition for a light-shielding film is preferably 20% by mass or more, relative to the total solids of the composition in the range of the mixing ratio of the black titanium pigment and the organic pigment. If the content of the black titanium pigment is 20% by mass or more, an excellent light-shielding property is exhibited in the infrared region, the light-transmitting property is high in a short-wavelength region (particularly less than 400 nm), and a colored pattern which is fine and excellent in the adhesion property can be obtained. The content of the black titanium pigment is more preferably from 25 to 70% by mass, and further preferably from 25 to 50% by mass, relative to the total solids of the composition.

Further, the content of the black titanium pigment in the total pigments is preferably 35% by mass or more relative to the total pigment. If the content of the black titanium pigment is 35% by mass or more relative to the total pigments, the light-shielding property is shown in the visible light region and the light-shielding property in the infrared region is maintained, and accordingly, a superior light-transmitting property can be obtained in a short-wavelength region (particularly less than 400 nm). In this regard, a colored pattern which is excellent in the light-shielding property in a wide-wavelength region, is fine, and is hardly peeled off and thus, a high adhesion property can be obtained. The content of the black titanium pigment is more preferably from 40 to 90% by mass, and further preferably from 50 to 90% by mass, relative to the mass of the total pigment fractions of the composition.

—Black Titanium Pigment—

The black titanium pigment in the invention is a black particle containing a titanium atom (black pigment). The black titanium pigment is preferably a low-dimensional titanium oxide, titanium oxynitride represented by $TiN_xO_y$, (wherein x and y are real numbers of less than 2), or the like.

The surface of the black titanium pigment can be modified, if necessary, for the purpose of improving dispersibility, inhibiting aggregability, or the like. Specifically, the surface can be coated with silicon oxide, titanium oxide, germanium oxide, aluminum oxide, magnesium oxide, or zirconium oxide. In addition, it is possible to carry out the surface treatment with a water-repellent material as described in JP-A No. 2007-302836.

Examples of the method for preparing the black titanium pigment include, but are not limited to, a method in which a mixture of titanium dioxide and metallic titanium is heated under a reducing atmosphere, thus carrying out reduction (see JP-A No. 49-5432), a method in which ultrafine titanium dioxide obtained by high-temperature hydrolysis of titanium tetrachloride is reduced under a reducing atmosphere containing hydrogen (see JP-A No. 57-205322), a method in which titanium dioxide or titanium hydroxide is reduced at a high temperature in the presence of ammonia (see JP-A No. 60-65069 and JP-A No. 61-201610), a method in which a vanadium compound is deposited on titanium dioxide or titanium hydroxide, and high-temperature reduction is carried out in the presence of ammonia (see JP-A No. 61-201610), and the like. However, the method of preparing the black titanium pigment is not limited to these.

The average primary particle diameter of the black titanium pigment is not particularly limited, but from the viewpoint of dispersibility and a coloration property, it is preferably from 3 nm to 2000 nm, more preferably from 10 nm to 500 nm, and particularly preferably from 10 nm to 100 nm.

The specific surface area of the black titanium pigment is not particularly limited, but in order to obtain predetermined performance for water repellency after the black titanium pigment is surface-treated with a water repellant, a value as measured by means of a BET method is preferably from about 5 $m^2/g$ to 150 $m^2/g$, and more preferably from about 20 $m^2/g$ to 100 $m^2/g$.

Examples of the commercially available black titanium pigment include black titanium 10S, 12S, 13R, 13M, 13M-C, 13R, 13R—N, and 13M-T sold by Mitsubishi Materials Corporation (manufactured by Jemco Inc.), TILACK D manufactured by Ako Kasei Co., Ltd., and the like.

The black titanium pigments may be used singly or in combination of two or more kinds thereof.

—Organic Pigment—

As the organic pigment in the invention, a pigment selected from a red organic pigment, a yellow organic pigment, a violet organic pigment, and an orange color organic pigment is used. Examples of the red organic pigment include C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like.

Examples of the violet organic pigment include C. I. Pigment Violet 1, 2, 19, 23, 27, 29, 32, 37, 42, and the like.

Examples of the yellow organic pigment include C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like.

Further, examples of the orange color organic pigment include C. I. Pigment Orange 2, 5, 13, 16, 17:1, 31, 34, 36, 38, 43, 46, 48, 49, 51, 52, 55, 59, 60, 61, 62, 64, 71, 73, and the like.

Among the organic pigments, from the viewpoint of having no adverse effect on the light transmittance in a short-wavelength region (particularly 400 nm or less) and increasing the light-shielding property in the visible region, a diketopyrrolopyrrole-based pigment, a perylene-based pigment, a benzimidazolone-based pigment, a perinone-based pigment, a naphthol AS-based pigment, an anthraquinone-based pigment, a pyrazolone-based pigment, or an isoindolinone-based pigment is preferable, and a diketopyrrolopyrrole-based pigment, a perylene-based pigment, a naphthol AS-based pigment, or an anthraquinone-based pigment is more preferable. C. I. Pigment Red 122, 150, 171, 175, 177, 209, 224, 242, 254, 255, 264; C. I. Pigment Yellow 11, 24, 108, 109, 110, 138, 139, 150, 151, 154, 167, 180, 185; or C. I. Pigment Orange 36, 38, 43, 64, 71 is particularly preferable.

—Other Pigments in Addition to Pigments Above—

In the colored composition for a light-shielding film of the invention, in addition to the above-described pigments, for the purpose of controlling the transmitting property of light in a light-transmitting region and a light-shielding region, or the like, organic pigments or extender pigments having other colors such as green, blue, black, and the like may be used in combination, if desired. Examples of the organic pigments having other colors include C. I. Pigment Green 7, 10, 36, 37, 58; C. I. Pigment Blue 1, 2, 15, 15:1, 15:2, 15:3, 15:4, 15:6, 16, 22, 60, 64, 66, 79, 80; C. I. Pigment Brown 25, 28; C. I. Pigment Black 1, 7, and the like. Examples of the extender pigment include barium sulfate, barium carbonate, calcium carbonate, silica, basic magnesium carbonate, alumina white, cloth white, titanium white, hydrotalcite, and the like. The amount of the extender pigment to be used is preferably from 5 to 50 parts by mass, and more preferably from 10 to 40 parts by mass, relative to 100 parts by mass of the black titanium pigment.

The content of the total pigments including the black titanium pigment and the organic pigment in the light-shielding colored composition is preferably from 15 to 60% by mass, and more preferably from 25 to 60% by mass, relative to the total solids of the colored composition. When the content of the total pigments is in the above-described range, a colored pattern which has an excellent light-shielding property in the visible light region through the infrared region, a high light-transmitting property in a short-wavelength region (particularly less than 400 nm), is fine, and has an excellent adhesion property can be obtained.

The colored composition for a light-shielding film of the invention is preferably configured to be photocurable by incorporating a photopolymerization initiator, a polymerizable compound, or a resin, in addition to the above-described pigments. Further, the colored composition for a light-shielding film may incorporate a pigment dispersant and/or a pigment derivative so as to have the above-described pigment dispersed therein.

—Resin—

The colored composition for a light-shielding film of the invention preferably contains at least one kind of the resin (resin other than the dispersant to be described later).

As the resin, a linear organic polymer is preferably used. As such a linear organic polymer, any known polymer may be used, and in order to enable aqueous development or weakly alkaline aqueous development, a linear organic polymer that is soluble or swellable in water or weakly alkaline water is preferably selected.

The linear organic polymer is selected and used according to an intended application not only as a film-forming agent but also as an aqueous, weakly alkaline aqueous, or organic solvent developing agent. For example, when a water-soluble organic polymer is used, water development can be conducted.

Examples of the linear organic polymer include radical polymers having a carboxylic acid group in a side chain, for example, those described in JP-A No. 59-44615, JP-B No. 54-34327, JP-B No. 58-12577, JP-B No. 54-25957, JP-A No. 54-92723, JP-A No. 59-53836, and JP-A No. 59-71048, that is, a resin formed by homopolymerization or copolymerization of a carboxyl group-containing monomer, a resin formed by hydrolysis, half-esterification, or half-amidation of an acid anhydride unit of a homopolymer or copolymer of an acid anhydride-containing monomer, and an epoxy acrylate in which an epoxy resin is modified with an unsaturated monocarboxylic acid or acid anhydride. Examples of the carboxyl group-containing monomer include acrylic acid, methacrylic acid, itaconic acid, crotonic acid, maleic acid, fumaric acid, 4-carboxylstyrene, and the like, and examples of the acid anhydride-containing monomer include maleic acid anhydride and the like. Further, acidic cellulose derivative similarly having a carboxylic acid group in the side branch thereof are also included. In addition, derivatives prepared by adding a cyclic acid anhydride to a hydroxyl group-having polymer, or the like are also useful.

Among the linear organic polymers, the linear organic polymer soluble or swellable in weak alkali water is hereinafter referred to as an "alkali-soluble resin".

Among them, (meth)acrylic resins having an allyl group or a vinyl ester group and a carboxyl group in a side chain, alkali-soluble resins having a double bond in a side chain described in JP-A No. 2000-187322 and JP-A No. 2002-62698, or alkali-soluble resins having an amide group in a side chain described in JP-A No. 2001-242612 are suitable since they are excellent in the balance among film strength, sensitivity, and developability. Furthermore, acid group-containing urethane-based binder polymers described in JP-B No 7-12004, JP-B No. 7-120041, JP-B No. 7-120042, JP-B No. 8-12424, JP-A No. 63-287944, JP-A No. 63-287947, JP-A No. 1-271741, JP-A No. 10-116232, and the like, and urethane-based binder polymers having an acid group and a double bond in a side chain described in JP-A No. 2002-107918 are advantageous in terms of printing durability/low exposure suitability since the strength is superior. Furthermore, the acid group-containing, acetal-modified polyvinyl alcohol-based, binder polymers described in the specifications of European Patent No. 993966 and European Patent No. 1204000, and JP-A No. 2001-318463 are suitable since they are excellent in the balance between film strength and developability. In addition, as the water soluble linear organic polymer, polyvinylpyrrolidone, polyethylene oxide, or the like is useful. Furthermore, in order to increase the strength of a cured film, an alcohol soluble nylon, a polyether of 2,2-bis (4-hydroxyphenyl)propane and epichlorohydrin, or the like is also useful.

Among the resins described above, a resin having a polymerizable group is preferable, and as the polymerizable group, a double bond-containing resin is more preferable, and a resin having an acryloyl group or a methacryloyl group is further preferable. The resin may be any of a random polymer, a block polymer, a graft polymer, and the like.

Further, the weight average molecular weight of the resin is preferably 5,000 or more, and more preferably in the range of 10,000 to 300,000, and the number average molecular weight is preferably more than 1,000, and more preferably in the range of 2,000 to 250,000. The polydispersity (weight average molecular weight/number average molecular weight) is preferably 1 or more, and more preferably in the range of 1.1 to 10.

The resins may be used singly or in combination of two or more kinds thereof.

The content of the resin (the total content in the case of two or more types) in the total solids of the colored composition for a light-shielding film is not particularly limited, but from the viewpoint of obtaining the effects according to the first embodiment of the invention more effectively, it is preferably from 5 to 50% by mass, more preferably from 10 to 40% by mass, and particularly preferably from 10 to 35% by mass.

—Polymerizable Compound—

The colored composition for a light-shielding film of the invention preferably contains at least one kind of polymerizable compound.

Examples of the polymerizable compound include addition polymerizable compounds having at least one ethylenically unsaturated double bond. Specifically, the polymerizable compound is selected from the compounds having at least one terminal ethylenically unsaturated bond, and preferably the compounds having at least two terminal ethylenically unsaturated bonds. Such a group of compounds is widely known in the present industrial field, and they may be used in the invention without any particular restriction. They may have any chemical configuration, for example, of a prepolymer, a dimer, a trimer, an oligomer, or a mixture or a (co)polymer thereof.

Examples of the monomers and a (co)polymer thereof include unsaturated carboxylic acid (for example, acrylic acid, methacrylic acid, itaconic acid, crotonic acid, isocrotonic acid, maleic acid, and the like), esters or amides thereof, and (co)polymers thereof, and preferably esters of an unsaturated carboxylic acid and an aliphatic polyhydric alcohol compound, amides of an unsaturated carboxylic acid and an aliphatic polyamine compound, or (co)polymers thereof. Furthermore, an addition reaction product of an unsaturated carboxylic acid ester or amide having a nucleophilic substituent such as a hydroxy group, an amino group, a mercapto group, and the like with a monofunctional or polyfunctional isocyanate or epoxy, a dehydration-condensation reaction product with a monofunctional or polyfunctional carboxylic acid, or the like may also be used suitably. Furthermore, an addition reaction product of an unsaturated carboxylic acid ester or amide having an electrophilic substituent such as an isocyanate group, an epoxy group, and the like with a monofunctional or polyfunctional alcohol, amine, or thiol, and a substitution reaction product of an unsaturated carboxylic acid ester or amide having a leaving substituent such as a halogen group, a tosyloxy group, and the like with a monofunctional or polyfunctional alcohol, amine, or thiol are also suitable. In addition, as other examples, a group of compounds in which the above-mentioned unsaturated carboxylic acid is replaced by an unsaturated phosphonic acid, styrene, vinyl ether, or the like may also be used.

Specific examples of ester monomers of an aliphatic polyhydric alcohol compound and an unsaturated carboxylic acid include acrylic acid esters such as an ethylene glycol diacrylate, a triethylene glycol diacrylate, a 1,3-butanediol diacrylate, a tetramethylene glycol diacrylate, a propylene glycol diacrylate, a neopentyl glycol diacrylate, a trimethylol propane triacrylate, a trimethylol propane tri(acryloyloxypropyl) ether, a trimethylol ethane triacrylate, a hexane diol diacrylate, a 1,4-cyclohexane diol diacrylate, a tetraethylene glycol diacrylate, a pentaerythritol diacrylate, a pentaerythritol triacrylate, a pentaerythritol tetraacrylate, a dipentaerythritol diacrylate, a dipentaerythritol hexaacrylate, a sorbitol triacrylate, a sorbitol tetraacrylate, a sorbitol pentaacrylate, a sorbitol hexaacrylate, a tri(acryloyloxyethyl) isocyanurate, a polyester acrylate oligomer, an EO-modified isocyanurate triacrylate, and the like. Further, examples of methacrylic acid esters include a tetramethylene glycol dimethacrylate, a triethylene glycol dimethacrylate, a neopentyl glycol dimethacrylate, a trimethylol propane trimethacrylate, a trimethylol ethane trimethacrylate, an ethylene glycol dimethacrylate, a 1,3-butanediol dimethacrylate, a hexanediol dimethacrylate, a pentaerythritol dimethacrylate, a pentaerythritol trimethacrylate, a pentaerythritol tetramethacrylate, a dipentaerythritol dimethacrylate, a dipentaerythritol hexamethacrylate, a sorbitol trimethacrylate, a sorbitol tetramethacrylate, a bis[p-(3-methacryloxy-2-hydroxypropoxy)phenyl]dimethylmethane, bis[p-(methacryloxyethoxy)phenyl]dimethylmethane, and the like. Further, examples of the itaconic acid ester include an ethylene glycol diitaconate, a propylene glycol diitaconate, a 1,3-butanediol diitaconate, a 1,4-butanediol diitaconate, a tetramethylene glycol diitaconate, a pentaerythritol diitaconate, a sorbitol tetraitaconate, and the like. Further, examples of the crotonic acid ester include an ethylene glycol dicrotonate, a tetramethylene glycol dicrotonate, a pentaerythritol dicrotonate, a sorbitol tetradicrotonate, and the like, and examples of the isocrotonic acid esters include an ethylene glycol diisocrotonate, a pentaerythritol diisocrotonate, a sorbitol tetraisocrotonate, and the like. Further, examples of the maleic acid esters include an ethylene glycol dimaleate, a triethylene glycol dimaleate, a pentaerythritol dimaleate, a sorbitol tetramaleate, and the like. As examples of other esters, aliphatic alcohol-based esters described in JP-B No. 51-47334 and JP-A No. 57-196231, those having an aromatic skeleton described in JP-A No. 59-5240, JP-A No. 59-5241, and JP-A No. 2-226149, those having an amino group described in JP-A No. 1-165613, or the like may also be suitably used. Moreover, the above-mentioned ester monomers may be used as a mixture.

Furthermore, specific examples of amide monomers of an aliphatic polyamine compound and an unsaturated carboxylic acid include a methylenebisacrylamide, a methylenebismethacrylamide, a 1,6-hexamethylenebisacrylamide, a 1,6-hexamethylenebismethacrylamide, a diethylenetriaminetrisacrylamide, a xylylenebisacrylamide, a xylylenebismethacrylamide, and the like. Examples of other preferable amide-based monomers include those having a cyclohexylene structure described in JP-B No. 54-21726.

Moreover, an urethane-based addition polymerizable compound prepared by the addition reaction of an isocyanate and a hydroxy group is also suitable, and specific examples thereof include a vinylurethane compound containing two or more polymerizable vinyl groups per molecule in which a hydroxy group-containing vinyl monomer represented by the general formula (A) below is added to a polyisocyanate compound having two or more isocyanate groups per molecule described in JP-B No. 48-41708, and the like.

$$CH_2=C(R^4)COOCH_2CH(R^5)OH \qquad (A)$$

[in the general formula (A), $R^4$ and $R^5$ each independently represents H or $CH_3$].

With regard to these polymerizable compounds, the structure thereof and details of an application method such as use thereof on their own or in combination and the amount thereof added may be freely set according to the eventual performance design of the colored composition for a light-shielding film. For example, from the viewpoint of sensitivity, a structure having a high unsaturated group content per molecule is preferable, and in many cases, di- or higher-functionality is preferable. Furthermore, in order to increase the strength of a cured coating, tri- or higher-functionality is better, and tetra- or higher-functionality is preferable. Furthermore, it is also effective to adjust both sensitivity and strength by using in combination different functionality/different polymerizable groups (for example, an acrylic acid ester, a methacrylic acid ester, a styrene-based compound, and a vinyl ether-based compound). In addition, selection and application methods of the polymerizable compound are important factors for compatibility and dispersibility with other components (for example, a photopolymerization initiator, a colorant (pigment, dye), a binder polymer, and the like) contained in the colored composition for a light-shielding film, and for example, the compatibility can be improved by the use of a low purity compound or the use of two or more types in combination. Moreover, in order to improve adhesion property to a hard surface such as a substrate and the like, a specific structure may be selected in some cases.

The content of the polymerizable compound (the total content in the case of two or more types) in the total solids of the colored composition for a light-shielding film is not particularly limited, but from the viewpoint of obtaining the effects of the first embodiment of the invention effectively, it is preferably from 10 to 80% by mass, more preferably from 15 to 75% by mass, and particularly preferably from 20 to 60% by mass.

—Photopolymerization Initiator—

The colored composition for a light-shielding film of the invention preferably contains at least one kind of a photopolymerization initiator. The photopolymerization initiator is not particularly limited as long as it polymerizes the above-mentioned polymerizable compounds, but it is preferably selected from the viewpoint of properties, initiation efficiency, absorption wavelength, availability, cost, or the like.

Examples of the photopolymerization initiator include at least one active halogen compound selected from a halomethyloxadiazole compound and a halomethyl-s-triazine compound, a 3-aryl-substituted coumarin compound, a lophine dimer, a benzophenone compound, an acetophenone compound, and a derivative thereof, a cyclopentadiene benzene/iron complex and a salt thereof, an oxime-based compound, and the like. Among these, from the viewpoint of further inhibiting the peeling of the color filter (particularly, the peeling when a color filter is formed on a substrate having a structure), or the like, an oxime-based compound is preferable.

The oxime-based compound (hereinafter, also referred to as an "oxime-based photopolymerization initiator") is not particularly limited, but examples thereof include the oxime-based compounds described in JP-A No. 2000-80068, WO02/100903 A1, and JP-A No. 2001-233842.

Specific examples thereof include, but are not limited to, 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethyl phenylthio)phenyl]-1,2-butanedione, 2-(O-benzoyloxime)-1-[4-(butyl phenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl)-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, 1-(O-acetyloxime)-1-[9-ethyl-6-(2-butylbenzoyl)-9H-carbazol-3-yl]ethanone, and the like.

Among these, 2-(O-benzoyloxime)-1-[4-(phenylthio)phenyl]-1,2-octanedione or 1-(O-acetyloxime)-1-[9-ethyl-6-(2-methylbenzoyl)-9H-carbazol-3-yl]ethanone is particularly preferable, and specific examples thereof include CGI-124, CGI-242 (manufactured by Ciba Specialty Chemicals Co., Ltd.), and the like.

Furthermore, an oxime compound having a specific substituent as described in JP-A No. 2007-269779 or an oxime compound having a thioaryl group as described in JP-A No. 2009-191061 is preferable.

Specifically, the oxime compound is preferably a compound represented by the following formula (I). In addition, it may be an oxime compound in the form of an (E) isomer with respect to the N—O bond of the oxime bond or a (Z) isomer, or a mixture of an oxime compound in the form of an (E) isomer and an oxime compound in the form of a (Z) isomer.

(I)

In the formula (I), R and B each independently represents a monovalent substituent, A represents a divalent organic group, and Ar represents an aryl group.

The monovalent substituent represented by R is preferably a monovalent non-metallic atomic group.

Examples of the monovalent non-metallic atomic group include an alkyl group, an aryl group, an acyl group, an alkoxycarbonyl group, an aryloxycarbonyl group, a heterocyclic group, an alkylthiocarbonyl group, an arylthiocarbonyl group, and the like. Further, these groups may have one or more substituents. Also, the substituent may further be substituted by another substituent.

Examples of the substituent include a halogen atom, an aryloxy group, an alkoxycarbonyl group, an aryloxycarbonyl group, an acyloxy group, an acyl group, an alkyl group, an aryl group, and the like.

The alkyl group which may have a substituent is preferably an alkyl group having 1 to 30 carbons, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having 6 to 30 carbons, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, o-, m-, and p-tolyl groups, a xylyl group, o-, m-, and p-cumenyl groups, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having 2 to 20 carbons, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbons, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably a nitrogen atom-, oxygen atom-, sulfur atom-, or phosphorus atom-containing aromatic or aliphatic heterocycle.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolidinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B above represents an aryl group, a heterocyclic group, an arylcarbonyl group, or a heterocyclic carbonyl group. Further, these groups may have one or more substituents. As the substituent, the above-mentioned monovalent substituents represented by R can be exemplified. Also, the above-mentioned substituents may further be substituted by another substituent.

Among them, the structures shown below are particularly preferable.

In the structures below, Y, X, and n have the same meanings as in the formula (II) as described below, and preferred examples are also the same.

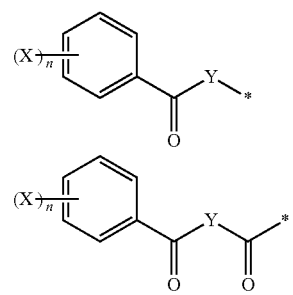

In the formula (I), examples of the divalent organic group represented by A above include an alkylene group having 1 to 12 carbon atoms, a cyclohexylene group having 6 to 12 carbon atoms, and an alkynylene group having 2 to 12 carbon atoms. Further, these groups may have one or more substituents. As the substituent, the above-mentioned substituents can be exemplified. Also, the above-mentioned substituents may further be substituted by another substituent.

Among them, from the viewpoint of enhancing the sensitivity and suppressing coloration due to heating over time, A is preferably an unsubstituted alkylene group, an alkyl group (for example, a methyl group, an ethyl group, a tert-butyl group, and a dodecyl group)-substituted alkylene group, an alkenyl group (for example, a vinyl group and an allyl group)-substituted alkylene group, or an aryl group (for example, a phenyl group, a p-tolyl group, a xylyl group, a cumenyl group, a naphthyl group, an anthryl group, a phenanthryl group, and a styryl group)-substituted alkylene group.

In the formula (I), the aryl group represented by Ar above is preferably an aryl group having 6 to 30 carbon atoms, and may have a substituent. As the substituent, the substituents mentioned as specific examples of the aryl group which may have a substituent as above can be exemplified.

Among them, from the viewpoint of enhancing the sensitivity and suppressing coloration due to heating over time, a substituted or unsubstituted phenyl group is preferable.

In the formula (I), from the viewpoint of sensitivity, the structure of 'SAr' formed by the Ar and the adjacent S is preferably a structure shown below. Further, Me represents a methyl group and Et represents an ethyl group.

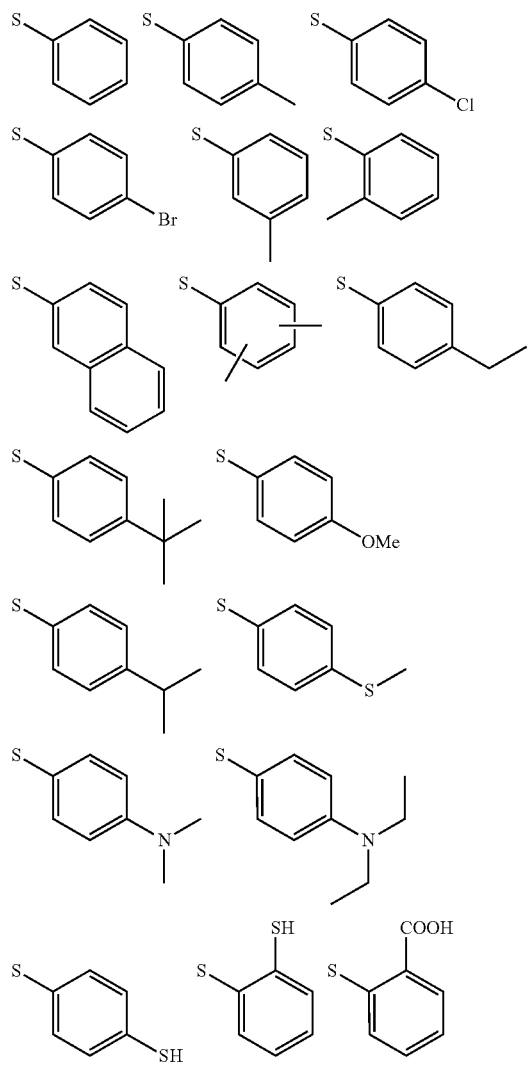

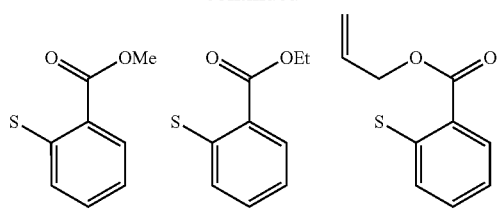

The oxime compound is preferably a compound represented by the following formula (II).

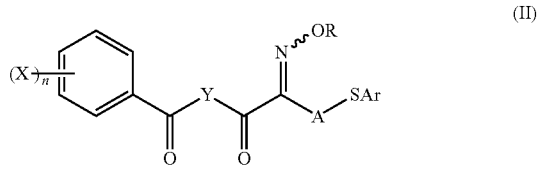

In the formula (II), R and X each independently represents a monovalent substituent, A and Y each independently represents a divalent organic group, Ar represents an aryl group, and n is an integer of 0 to 5. In the formula (II), R, A, and Ar have the same meanings as R, A, and Ar, respectively, in the formula (I) above and preferred examples thereof are also the same.

Examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen atom. Further, these groups may have one or more substituents. As the substituent, the above-mentioned monovalent substituents represented by R can be exemplified. Also, the above-mentioned substituent may further be substituted by another substituent.

Among them, from the viewpoint of the solvent solubility and the improvement of absorption efficiency in a long wavelength region, X is preferably an alkyl group.

Furthermore, n in the formula (II) represents an integer of 0 to 5, and preferably an integer of 0 to 2.

As the divalent organic group represented by Y above, the structures shown below can be cited. Further, in the groups shown below, '*' represents a bonding position to a carbon atom adjacent to Y in the formula (II) above.

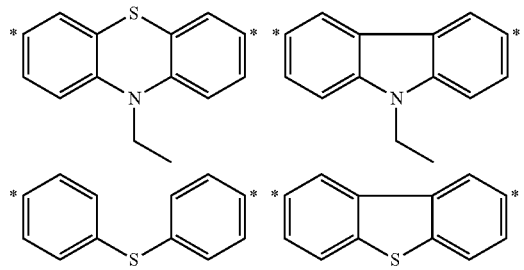

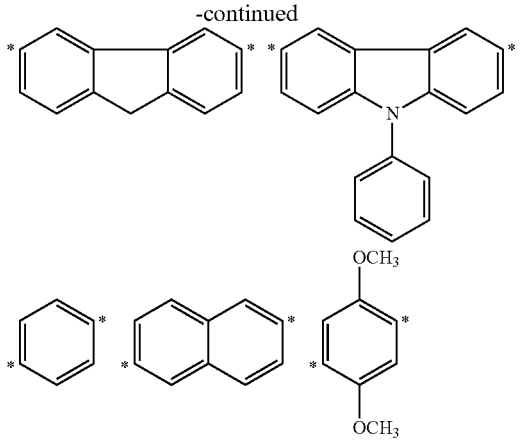

Among them, from the viewpoint of the high sensitivity, the structures shown below are preferable.

Furthermore, the oxime compound is preferably a compound represented by the following formula (III).

In the formula (III), R and X each independently represents a monovalent substituent, A represents a divalent organic group, Ar represents an aryl group, and n is an integer of 0 to 5.

R, X, A, Ar, and n in the formula (III) have the same meanings as R, X, A, Ar, and n, respectively, in the formula (II) above, and preferred examples are also the same.

Specific examples (B-1) to (B-10) of the oxime compound which is preferably used are shown below, but the present invention is not limited thereto.

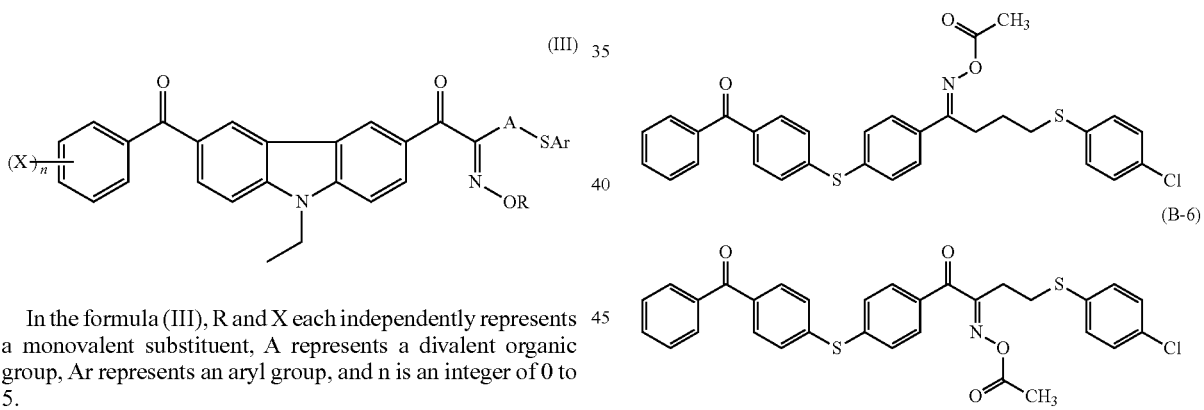

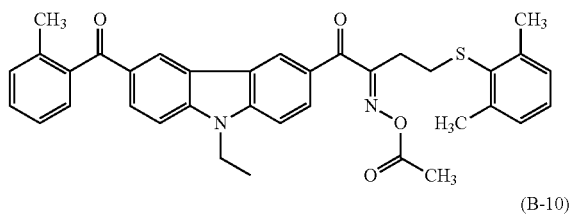

(B-9)

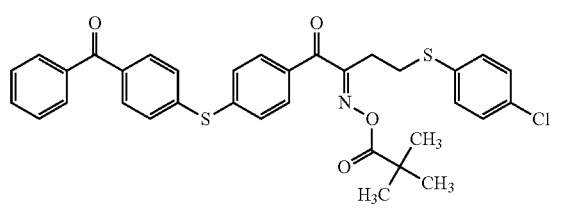

(B-10)

These photopolymerization initiators may employ a sensitizer or a light stabilizer in combination.

Further, the colored composition for a light-shielding film of the invention may use other known initiators other than the above-described photopolymerization initiators.

The photopolymerization initiators may be contained singly or in combination of two or more kinds thereof.

From the viewpoint of obtaining the effects of the invention more effectively, the content of the photopolymerization initiator in the total solids of the colored composition for a light-shielding film (the total content in the case of two or more types) is preferably from 3 to 20% by mass, more preferably from 4 to 19% by mass, and particularly preferably from 5 to 18% by mass.

—Dispersant—

Examples of the dispersant in the invention include a polymer dispersant [for example, a polyamidoamine and a salt thereof, a polycarboxylic acid and a salt thereof, a high-molecular unsaturated acid ester, a modified polyurethane, a modified polyester, a modified poly(meth)acrylate, a (meth)acryl-based copolymer, and a naphthalenesulfonic acid formalin condensate], a polyoxyethylene alkyl phosphate ester, a polyoxyethylenealkylamine, an alkanolamine, a pigment derivative, and the like.

The dispersant in the invention can be classified into a straight polymer, a terminal-modified polymer, a graft polymer, and a block polymer depending on its structure.

The dispersant is adsorbed on a surface of the black titanium pigment and an organic pigment used in combination therewith, and acts so as to prevent re-aggregation. For this reason, a graft polymer, a polymer having an acidic group on the terminal of a linear polymer, a polymer having an acidic group on the terminal of a graft polymer, a star polymer, a block polymer, or the like can be used. Among those, from the viewpoint of dispersion stability, a graft polymer is preferable.

Further, the pigment derivative has an effect of promoting adsorption of the dispersion resin when the pigment surface of the dispersant is modified.

The main chain structure of the graft polymer is not particularly limited, but examples thereof include a poly(meth)acryl structure, a polyester structure, a polyurethane structure, a polyurea structure, and the like. Among these, in view of easy synthesis, a poly(meth)acryl structure is preferable.

As the graft polymer, a graft copolymer can be used.

As the graft copolymer, those having a graft chain in which the number of atoms excluding a hydrogen atom is in the range of 40 to 10000 are preferable. The graft chain herein refers to a chain from a source of the main chain of the copolymer to a terminal of the group branched from the main chain.

In the colored composition for a light-shielding film, this graft copolymer is a dispersion resin which provides the black titanium pigment with dispersibility, and since it has excellent dispersibility and affinity for a solvent due to the graft chain, it is excellent in dispersibility of the black titanium pigment and dispersion stability after the passage of time. Further, when it is made into a photosensitive resin composition, it has affinity for polymerizable compounds, other resins usable in combination, or the like due to the graft chain, and as a result, it is difficult to generate the residues upon alkali development.

When the length of the graft chain is increased, the steric repulsion effect is enhanced, and thus, the dispersibility is improved. On the other hand, when the length of the graft chain is too much, the adsorption force onto the black titanium pigment is decreased, resulting in reduction in the dispersibility. From this reason, as the graft copolymer used in the invention, those having a graft chain in which the number of atoms excluding a hydrogen atom per graft chain is in the range of 40 to 10000 are preferable, those having a graft chain in which the number of atoms excluding a hydrogen atom per graft chain is in the range of 50 to 2000 are more preferable, and those having a graft chain in which the number of atoms excluding a hydrogen atom per graft chain is in the range of 60 to 500 are further preferable.

As the polymer structure of the graft chain, a poly(meth)acryl, a polyester, a polyurethane, a polyurea, a polyamide, a polyether, or the like can be used, but in view of improvement of the interaction property between a graft site and a solvent, and correspondingly enhancement of the dispersibility, graft chains having a poly(meth)acryl structure, a poly(meth)acryl, a polyester, or a polyether are preferable, and those having a polyester or a polyether are more preferable.

The structure of the macromonomer having such a polymer structure as a graft chain is not particularly limited as long as it has a substituent capable of reacting with a polymer main chain portion, and thus satisfying the requirements of the first embodiment of the invention, but a macromonomer having a group capable of forming a reactive double bond can be preferably used.

As the commercially available macromonomer which is suitably used for synthesis of the graft copolymer, AA-6 (manufactured by Toagosei Co., Ltd.), AA-10 (manufactured by Toagosei Co., Ltd.), AB-6 (manufactured by Toagosei Co., Ltd.), AS-6 (manufactured by Toagosei Co., Ltd.), AN-6 (manufactured by Toagosei Co., Ltd.), AW-6 (manufactured by Toagosei Co., Ltd.), AA-714 (manufactured by Toagosei Co., Ltd.), AY-707 (manufactured by Toagosei Co., Ltd.), AY-714 (manufactured by Toagosei Co., Ltd.), AK-5 (manufactured by Toagosei Co., Ltd.), AK-30 (manufactured by Toagosei Co., Ltd.), AK-32 (manufactured by Toagosei Co., Ltd.), BLEMMER PP-100 (manufactured by NOF Corporation), BLEMMER PP-500 (manufactured by NOF Corporation), BLEMMER PP-800 (manufactured by NOF Corporation), BLEMMER PP-1000 (manufactured by NOF Corporation), BLEMMER 55-PET-800 (manufactured by NOF Corporation), BLEMMER PME-4000 (manufactured by NOF Corporation), BLEMMER PSE-400 (manufactured by NOF Corporation), BLEMMER PSE-1300 (manufactured by NOF Corporation), BLEMMER 43 PAPE-600 B (manufactured by NOF Corporation), or the like is used. Among those, AA-6 (manufactured by Toagosei Co., Ltd.), AA-10 (manufactured by Toagosei Co., Ltd.), AB-6 (manufactured by Toagosei Co., Ltd.), AS-6 (manufactured by Toagosei Co., Ltd.), AN-6 (manufactured by Toagosei Co., Ltd.), BLEMMER PME-4000 (manufactured by NOF Corporation), or the like is preferably used.

The graft site in the graft copolymer in the invention preferably contains at least a structure unit represented by any one of the formula (1) to the formula (5) below.

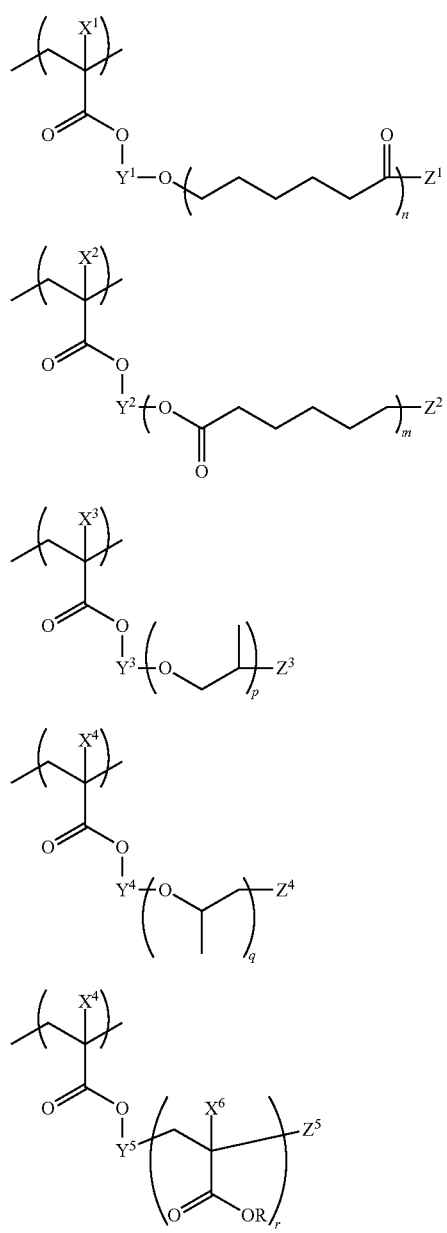

In the formula (1) to the formula (5), $X^1$, $X^2$, $X^3$, $X^4$, $X^5$, and $X^6$ each independently represents a hydrogen atom or a monovalent organic group. From the viewpoint of the restriction in the synthesis, they are preferably a hydrogen atom, more preferably an alkyl group having 1 to 12 carbon atoms, further preferably a hydrogen atom or a methyl group, and particularly preferably a methyl group.

In the formula (1) to the formula (5), $Y^1$, $Y^2$, $Y^3$, $Y^4$, and $Y^5$ each independently represents a divalent linkage, and are not particularly restricted in terms of the structures. Specific examples thereof include the linkages from (Y-1) to (Y-20) below linkage, and the like. In the structures below, A and B each represent a bond between the left terminal group and the right terminal group in the formula (1) to the formula (5). Among the structures represented below, in view of easy synthesis, (Y-2) and (Y-13) are more preferable.

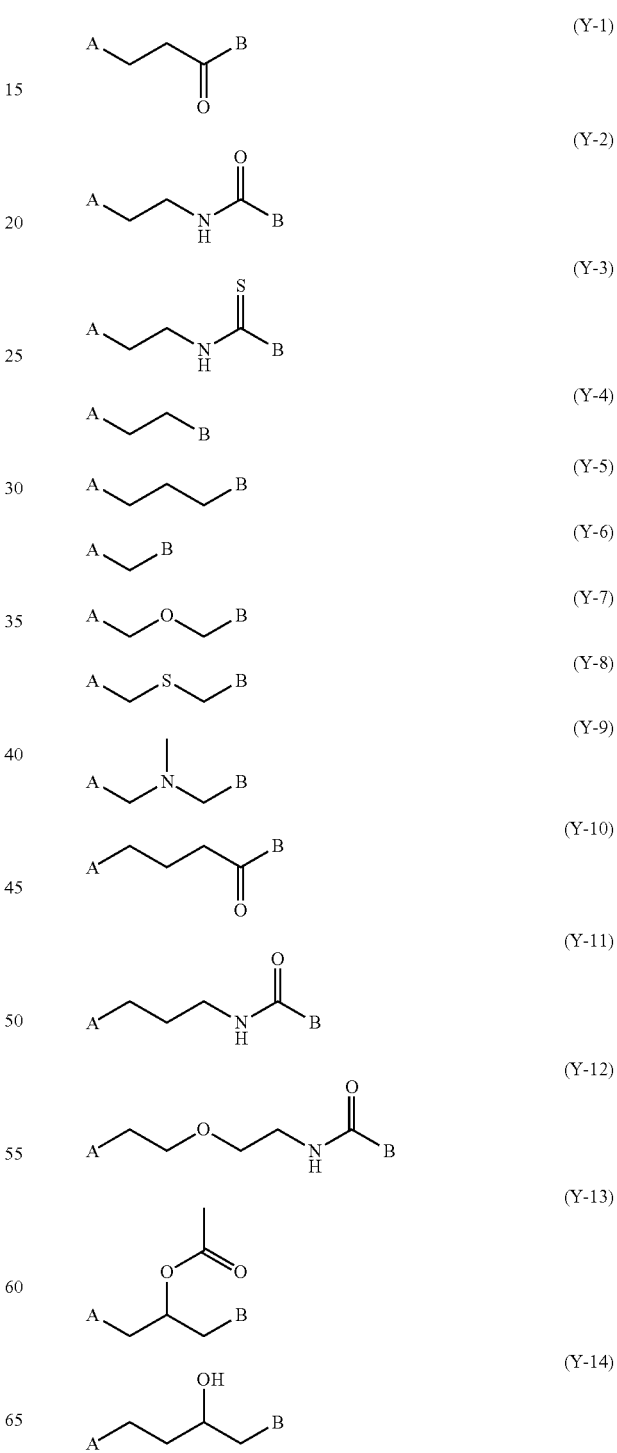

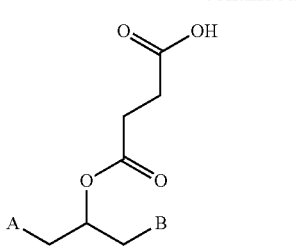 (Y-15)

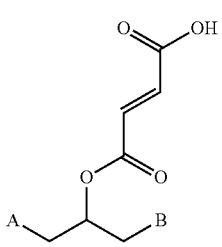 (Y-16)

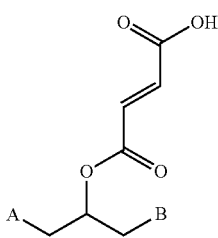 (Y-17)

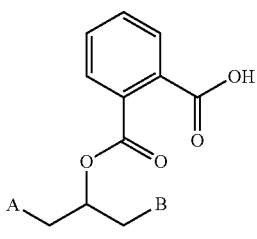 (Y-18)

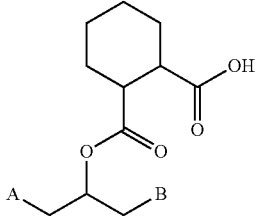 (Y-19)

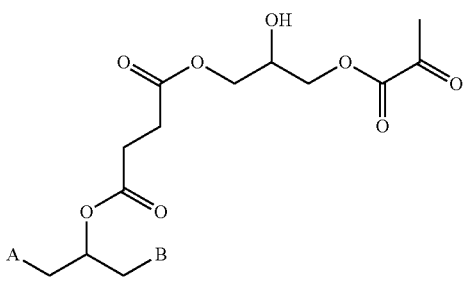 (Y-20)

In the formula (1) to the formula (5), $Z^1$, $Z^2$, $Z^3$, $Z^4$, and $Z^5$ each independently represents a monovalent organic group, and are not particularly limited in structure. Specific examples of $Z^1$, $Z^2$, $Z^3$, $Z^4$, and $Z^5$ each independently includes a hydroxyl group, an alkyl group, an alkoxy group, an aryloxy group, a heteroaryloxy group, an alkyl thioether group, an aryl thioether group, a heteroaryl thioether group, an amino group, and the like. Among these, it is particularly preferable to have a steric repulsion effect from the viewpoint of improved dispersibility. An alkyl group having 5 to 24 carbon atoms is preferable, and among those, a branched alkyl group having 5 to 24 carbon atoms or a cyclic alkyl group having 5 to 24 carbon atoms is particularly preferable.

In the formula (1) to the formula (5), n, m, p, q, and r each represent an integer of 1 to 500.

In the graft copolymer, the structure units represented by the formula (1) to the formula (5) are contained at an amount in the range of 10% to 90% by mass, relative to the total mass of the graft copolymer, and more preferably in the range of 30% to 70% by mass. Within this range, the dispersibility of the black titanium pigment is high and the developability when the black titanium pigment is used in the resist is good. Further, in the graft copolymer used in the invention, graft copolymers having two or more different structures can be contained.

In the formula (5), R represents a monovalent organic group, and is not particularly limited in structure. R is preferably a hydrogen atom, an alkyl group, an aryl group, or a heteroaryl group, and more preferably a hydrogen atom or an alkyl group. Further, as R, two or more R's having different structures in the graft copolymerized product may be used.

As the graft copolymer, a functional group capable of forming an interaction with the black titanium pigment, in addition to the graft site, can be introduced. Among those, for example, a structure unit having an acidic group, a structure unit having a basic group, a structure unit having a coordinating bond, a structure unit having reactivity, and the like may be mentioned.

Examples of the acidic group include a carboxylic acid group, a sulfonic acid group, a phosphoric acid group, a phenolic hydroxyl group, and the like, and a carboxylic acid which has a good adsorption force to a black titanium pigment as well as high dispersibility is particularly preferable. These may be used singly or in combination of two or more kinds thereof.

By introducing such an acidic group, there is attained an advantage that the alkali developability of the graft copolymer is improved.

The content of these copolymerization components which are suitably used in the graft copolymer is from 0.1% by mole to 50% by mole, and particularly preferably from 1% by mole to 30% by mole from the viewpoint of inhibition of the damage on the image strength by alkali development.

Examples of the basic group include a primary amino group, a secondary amino group, a tertiary amino group, an N atom-containing hetero ring, an amide group, and the like, and a tertiary amino group which has good adsorption force to a pigment as well as high dispersibility is particularly preferable. These may be used singly or in combination of two or more kinds thereof. The content of these copolymerization components which are suitably used in the graft copolymer is from 0.01% by mole to 50% by mole, and particularly preferably from 0.01% by mole to 30% by mole, from the viewpoint of inhibition of the developability suppression.

Examples of the group having a coordinating group and having reactivity include an acetylacetoxy group, a trialkoxysilyl group, an isocyanate group, an acid anhydride, an acid chloride, and the like, and an acetylacetoxy group which has a good adsorption force to a pigment and thus has high dispersibility is particularly preferable. These may be used singly or in combination of plural kinds thereof. The content of these copolymerization components which are suitably used in the graft copolymer is from 0.5% by mole to 50% by mole, and particularly preferably from 1% by mole to 30% by mole, from the viewpoint of inhibition of the developability suppression.

The structure of the functional group which is capable of forming an interaction with the black titanium pigment and/or the organic pigment, in addition to the graft site, is not particularly limited as long as it contains the functional group, but it is preferably to contain at least one repeating unit obtained from the monomers represented by the formulae (i) to (iii) below.

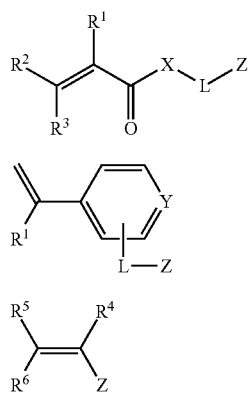

In the formulae (i) to (iii), $R^1$, $R^2$, and $R^3$ each independently represents a hydrogen atom, a halogen atom (for example, fluorine, chorine, bromine, and the like), or an alkyl group having 1 to 6 carbon atoms (for example, a methyl group, an ethyl group, a propyl group, and the like).

$R^1$, $R^2$, and $R^3$ are more preferably a hydrogen atom, or an alkyl group having 1 to 3 carbon atoms, and most preferably a hydrogen atom or a methyl group. $R^2$ and $R^3$ are particularly preferably a hydrogen atom.

X represents preferably an oxygen atom (—O—) or an imino group (—NH—), and preferably an oxygen atom.

L is a single bond or a divalent linkage. Examples of the divalent linkage include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, and a combination thereof with an oxygen atom (—O—), a sulfur atom (—S—), an imino group (—NH—), a substituted imino group (—NR$^{31}$—, wherein R$^{31}$ is an aliphatic group, an aromatic group, or a heterocyclic group), a carbonyl group (—CO—), and the like.

The divalent aliphatic group may have a cyclic structure or a branched structure. The number of carbon atoms of the aliphatic group is preferably from 1 to 20, more preferably from 1 to 15, and further preferably from 1 to 10. The aliphatic group is preferably an unsaturated aliphatic group, and more preferably a saturated aliphatic group. Further, the aliphatic group may have a substituent. Examples of the substituent include a halogen atom, a hydroxyl group, an aromatic group, and a heterocyclic group.

The number of carbon atoms of the divalent aromatic group is preferably from 6 to 20, more preferably from 6 to 15, and most preferably from 6 to 10. Further, the aromatic group may have a substituent. Examples of the substituent include a halogen atom, a hydroxyl group, an aliphatic group, an aromatic group, and a heterocyclic group.

The divalent heterocyclic group is preferably a heterocycle, which has a 5- or 6-membered ring. The heterocycle may be condensed with another heterocycle, aliphatic ring, or aromatic ring. Further, the heterocyclic group may have a substituent. Examples of the substituent include a halogen atom, a hydroxy group, an oxo group (=O), a thioxo group (=S), an imino group (=NH), a substituted imino group (=N—R$^{32}$, wherein R$^{32}$ is an aliphatic group, an aromatic group, or a heterocyclic group), an aliphatic group, an aromatic group, and a heterocyclic group.

L is preferably a single bond, an alkylene group, or a divalent linkage containing an oxyalkylene structure. The oxyalkylene structure is more preferably an oxyethylene structure or an oxypropylene structure. Further, L may contain a polyoxyalkylene structure including two or more oxyalkylene structures. The polyoxyalkylene structure is preferably a polyoxyethylene structure or a polyoxypropylene structure. The polyoxyethylene structure is represented by —(OCH$_2$CH$_2$)$_n$—, wherein n preferably represents an integer of 2 or more, and more preferably an integer of 2 to 10.

In the formulae (i) to (iii), Z represents a functional group capable of forming an interaction with the black titanium pigment and/or the organic pigment, in addition to the graft site, and it is preferably a carboxylic acid or a tertiary amino group, and more preferably a carboxylic acid. Further, Y represents a methine group or a nitrogen atom.

In the formula (iii), $R^4$, $R^5$, and $R^6$ each independently represents a hydrogen atom, a halogen atom (for example, fluorine, chlorine, bromine, and the like), or an alkyl group having 1 to 6 carbon atoms (for example, a methyl group, an ethyl group, a propyl group, and the like), Z, or -L-Z. Here, L and Z have the same definitions as above. $R^4$, $R^5$, and $R^6$ are preferably a hydrogen atom or an alkyl group having 1 to 3 carbon atoms, and more preferably a hydrogen atom.

In the invention, as the monomer represented by the general formula (i), preferred is a compound in which $R^1$, $R^2$, and $R^3$ represent a hydrogen atom or a methyl group, L represents an alkylene group, or a divalent linkage containing an oxyalkylene structure, X represents an oxygen atom or an imino group, and Z represents a carboxylic acid. Further, as the monomer represented by the general formula (ii), preferred is a compound in which $R^1$ represents a hydrogen atom or a methyl group, L represents an alkylene group, Z represents a carboxylic acid, and Y represents a methine group. Further, as the monomer represented by the general formula (iii), preferred is a compound in which $R^4$, $R^3$, and $R^6$ represent a hydrogen atom or a methyl group, and Z represents a carboxylic acid.

Alternatively, in this case, particularly preferred is a case where the compound has a structure unit represented by the formula (1), and $Y^1$ represents (Y-2) or (Y-13).

Hereinbelow, representative examples of the compounds represented by the formulae (i) to (iii) include the following:

methacrylic acid, crotonic acid, isocrotonic acid, a reaction product of a compound having an addition polymerizable double bond and a hydroxyl group in the molecule (for example, 2-hydroxyethyl methacrylate) with a succinic acid anhydride, a reaction product of a compound having an addition polymerizable double bond and a hydroxyl group in the molecule with a phthalic acid anhydride, a reaction product of a compound having an addition polymerizable double bond and a hydroxyl group in the molecule with a tetrahydroxyphthalic acid anhydride, a reaction product of a compound having an addition polymerizable double bond and a hydroxyl group in the molecule with anhydrous trimellitic acid, a reaction product of a compound having an addition polymerizable double bond and a hydroxyl group in the molecule with a pyromellitic acid anhydride, acrylic acid, acrylic acid a dimer, an acrylic acid oligomer, maleic acid, itaconic acid, fumaric acid, 4-vinylbenzoic acid, vinyl phenol, 4-hydroxyphenyl methacryl amide, and the like.

The content of the functional group capable of forming an interaction with the black titanium pigment and/or the organic pigment, such as a monomer having an acidic group, and the like, in the graft copolymer, is preferably from 0.05 to 90% by mass, more preferably from 1.0 to 80% by mass, and further preferably from 10 to 70% by mass, relative to the graft copolymer, from the viewpoint of dispersion stability and a penetration property into a developer.

Moreover, the graft copolymer contained in the colored composition for a light-shielding film can include other structure units having further various functions, for example, functional groups having affinity for a dispersion solvent used for a dispersed product, and the like, as a copolymerization component, in addition to the above-described structure unit having the graft site and the functional group capable of forming an interaction with the black titanium pigment and/or the organic pigment, for the purpose of improving all the performances such as image strength and the like, within a range not interfering with the effect of the first embodiment of the invention.

In the graft copolymer according to the invention, examples of the copolymerizable copolymerization component include radical polymerizable compounds selected from acrylic acid esters, methacrylic acid esters, styrenes, acrylonitriles, methacrylonitriles, and the like. These may be used singly or in combination of two or more kinds thereof, and the content of these copolymerization components in the graft copolymer is from 0% by mole to 90% by mole, and particularly preferably from 0% by mole to 60% by mole. With the content in this range, sufficient pattern formation can be accomplished.

Examples of the solvent used in the synthesis of the graft copolymer include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethyl formamide, N,N-dimethyl acetamide, dimethylsulfoxide, toluene, ethyl acetate, methyl lactate, ethyl lactate, and the like. These solvents may be used singly or as a mixture of two or more kinds thereof.

Specific examples of these graft copolymers include the following exemplary compounds 1 to 53. In addition, the attached figures (wt %) of each constituent unit (main chain portion) are based on mass (% by mass).

(Exemplary Compound 1)

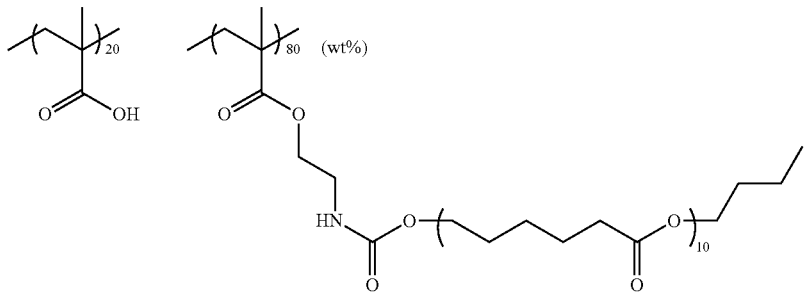

(Exemplary Compound 2)

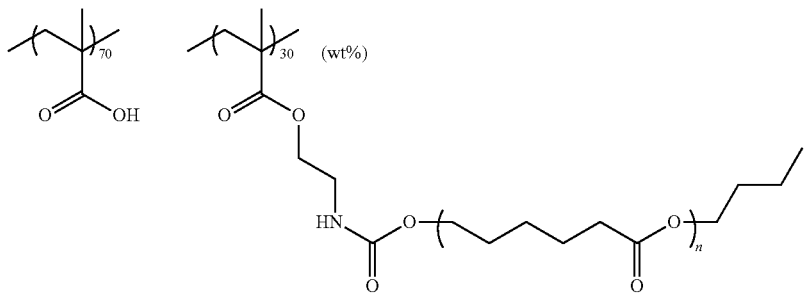

(Exemplary Compound 3)

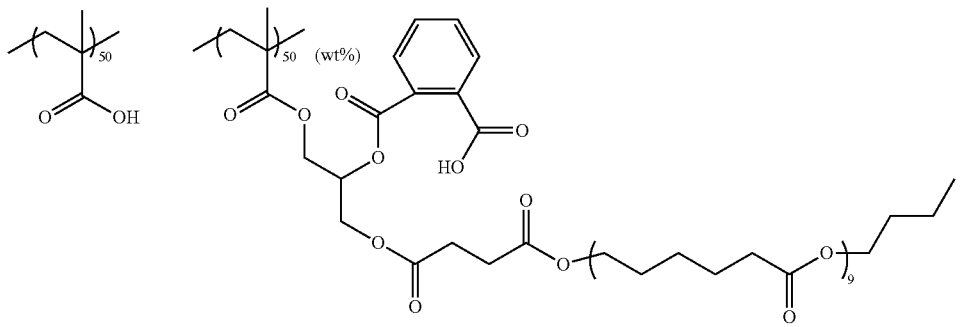

(Exemplary Compound 4)
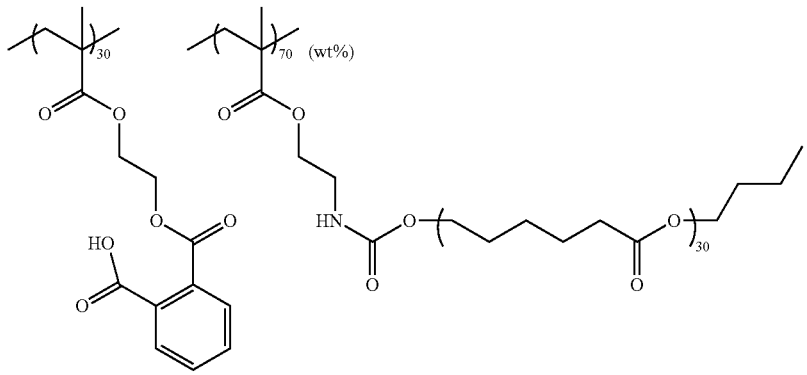
(Exemplary Compound 5)
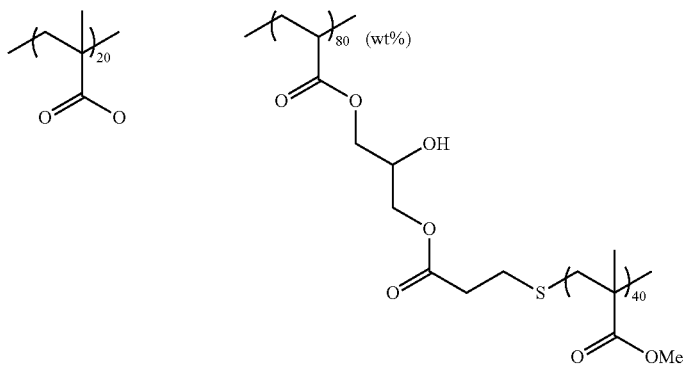
(Exemplary Compound 6)
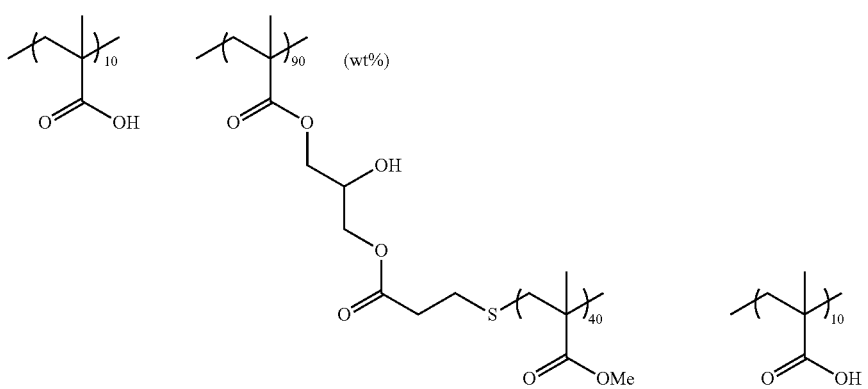

-continued
(Exemplary Compound 7)
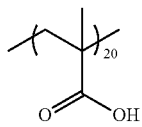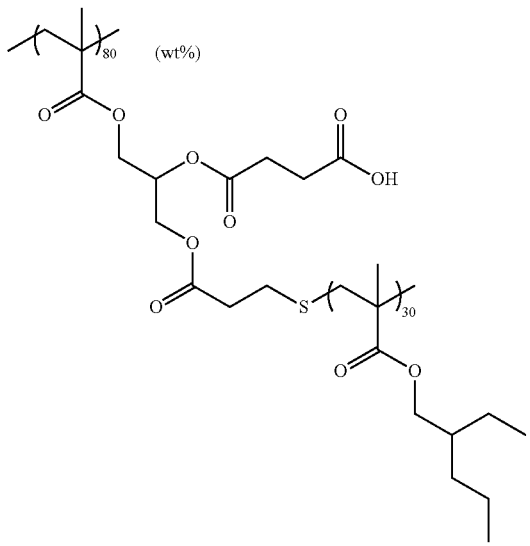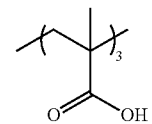
(Exemplary Compound 8)
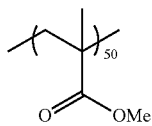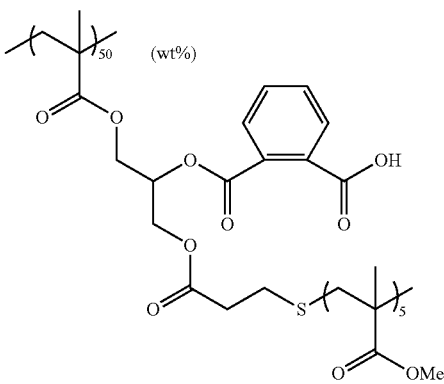
(Exemplary Compound 9)
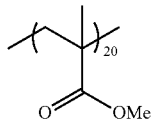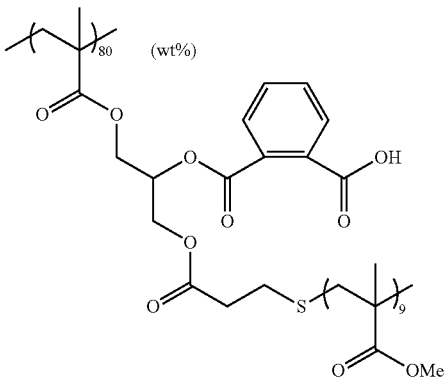

-continued
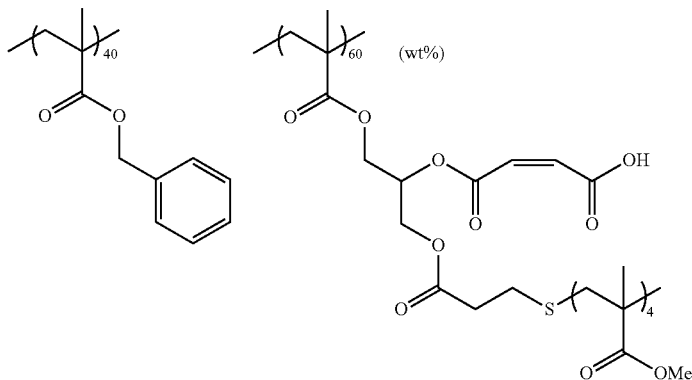
(Exemplary Compound 10)
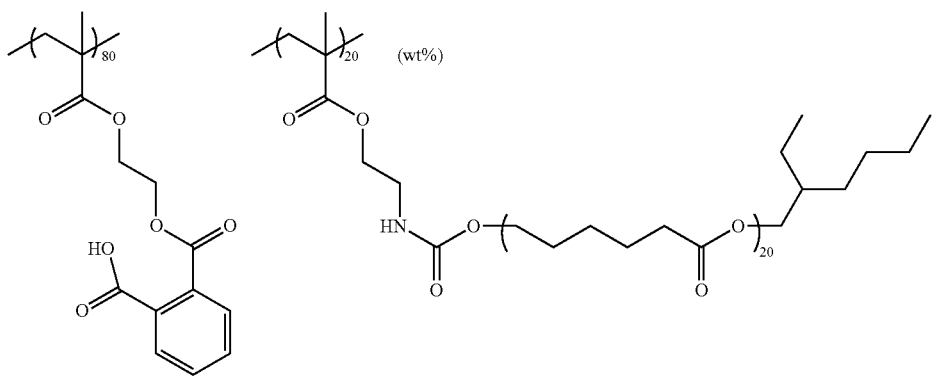
(Exemplary Compound 11)
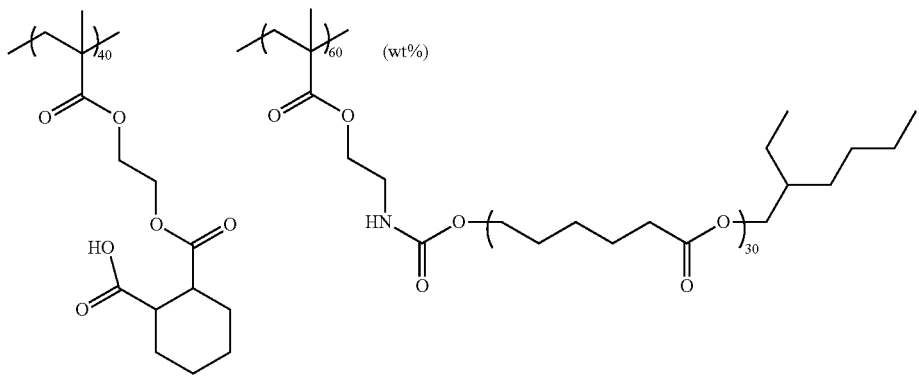
(Exemplary Compound 12)
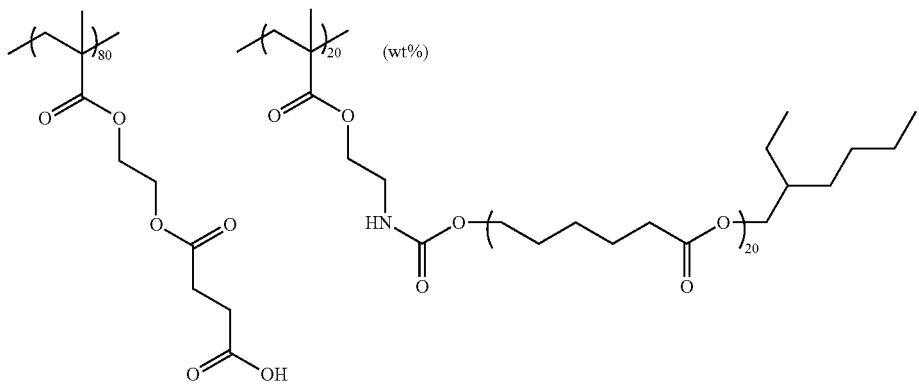
(Exemplary Compound 13)

(Exemplary Compound 14)
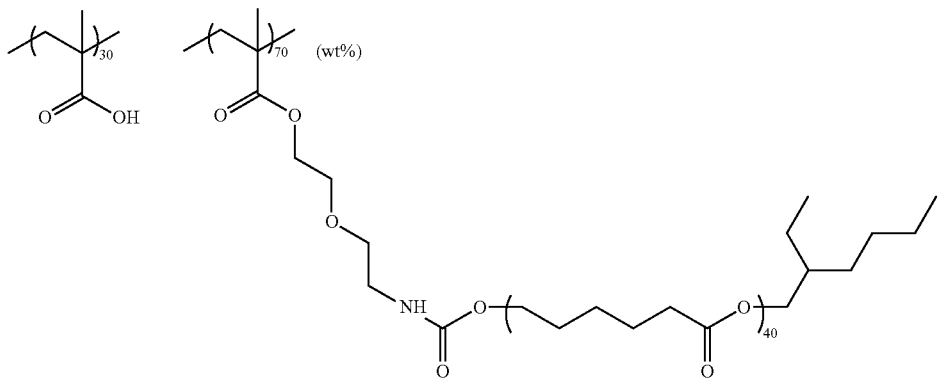
(Exemplary Compound 15)
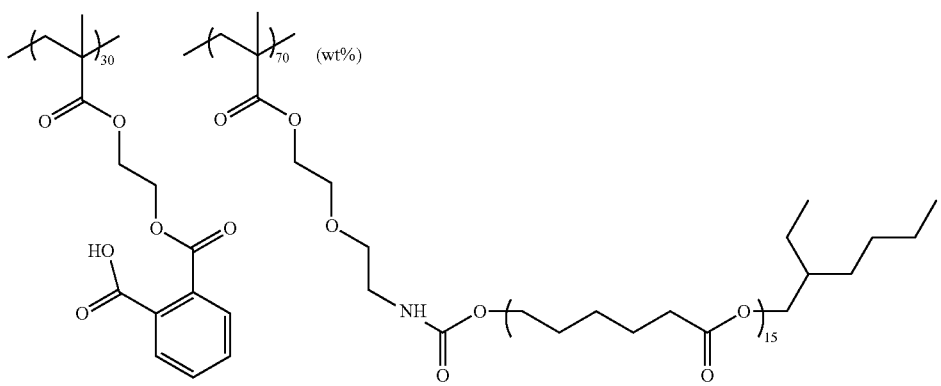
(Exemplary Compound 16)
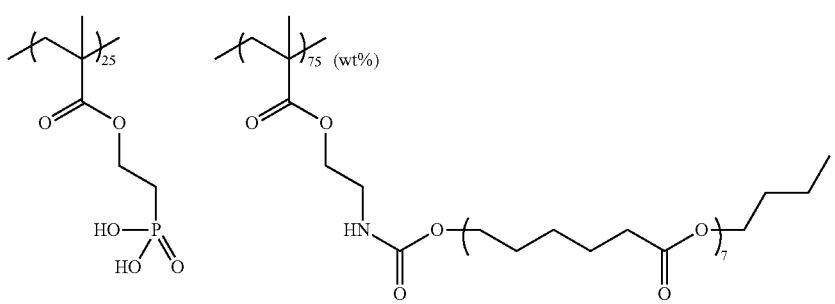
(Exemplary Compound 17)
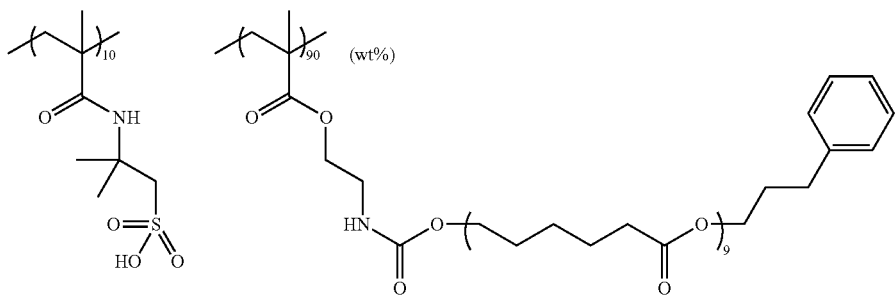

-continued
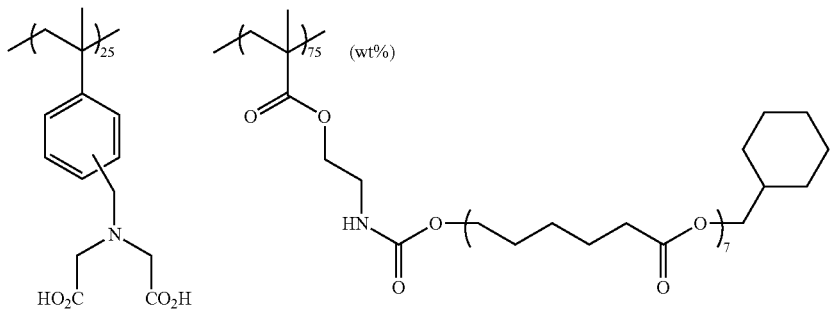
(Exemplary Compound 18)
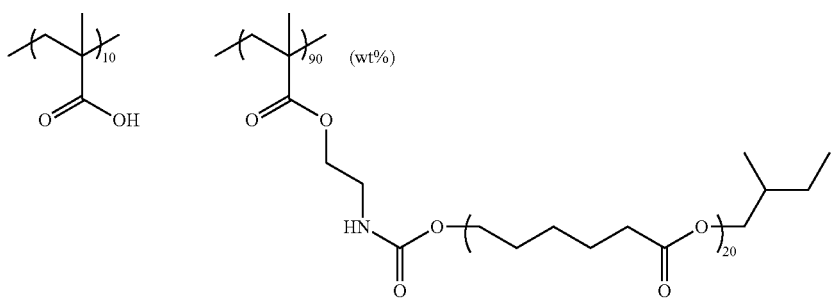
(Exemplary Compound 19)
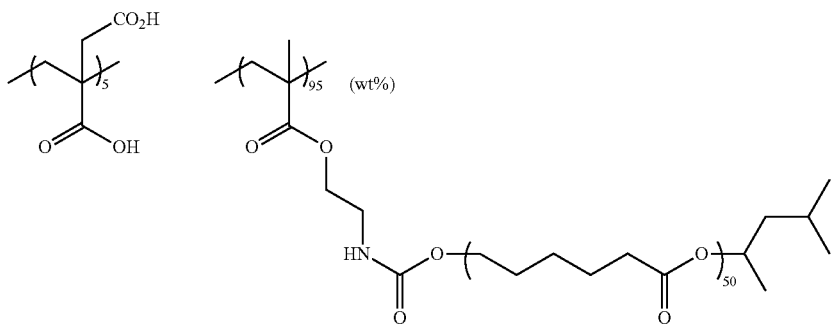
(Exemplary Compound 20)
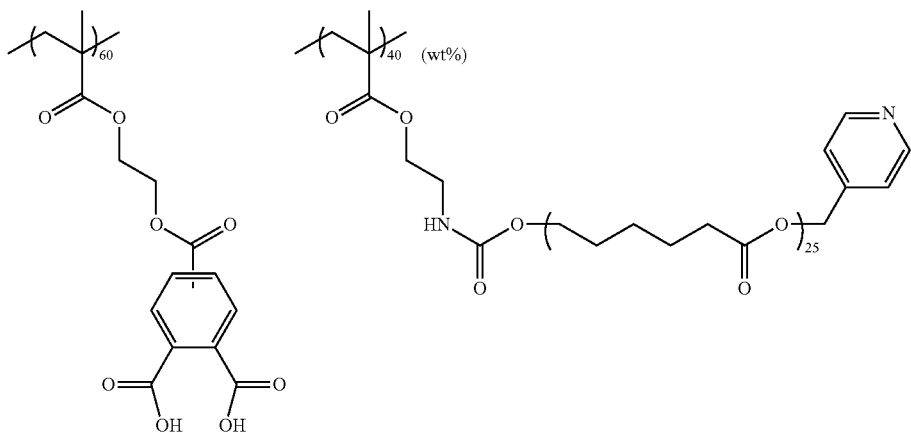
(Exemplary Compound 21)

-continued
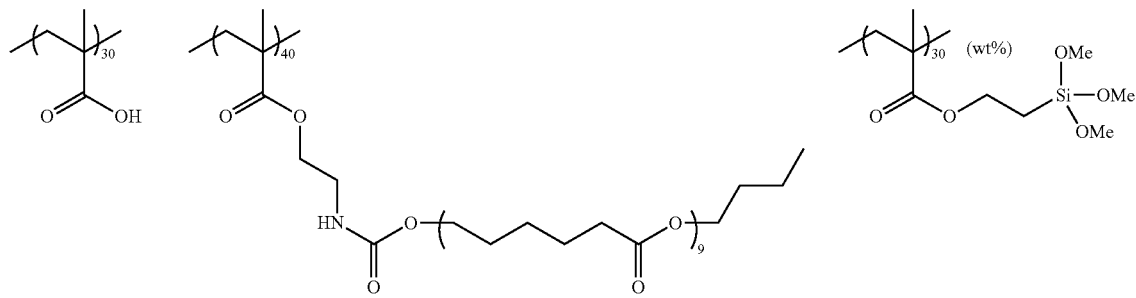
(Exemplary Compound 22)
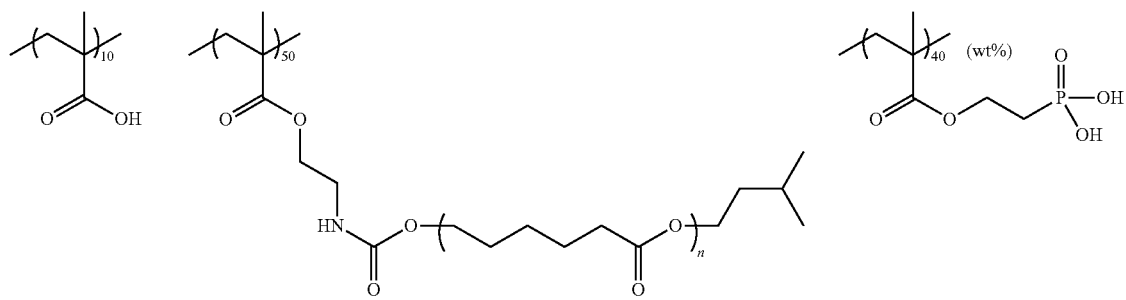
(Exemplary Compound 23)
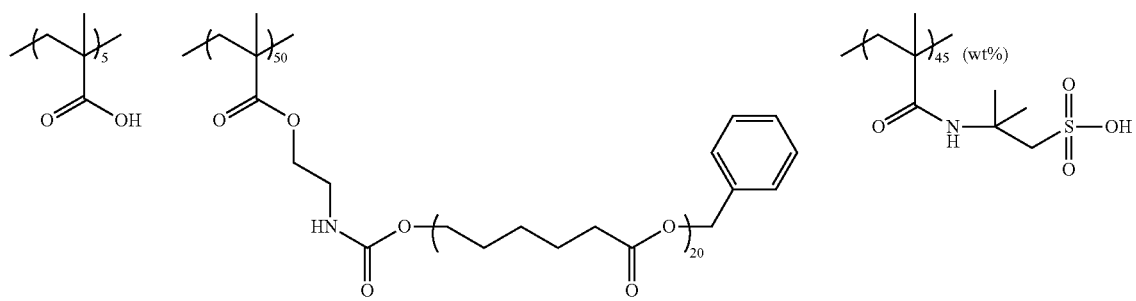
(Exemplary Compound 24)
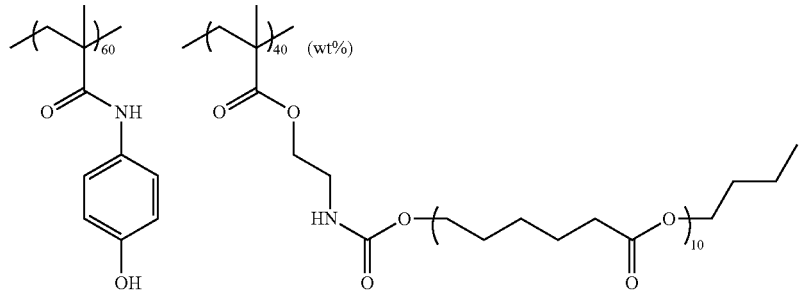
(Exemplary Compound 25)
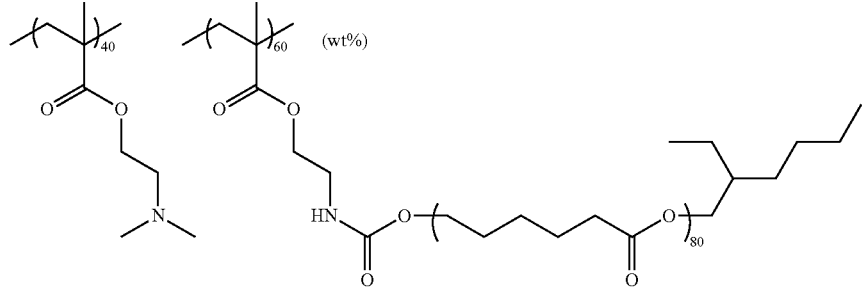
(Exemplary Compound 26)

(Exemplary Compound 27)
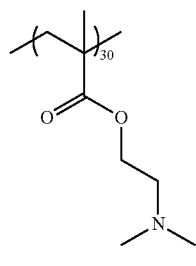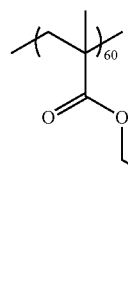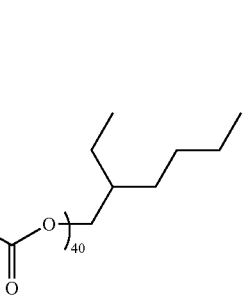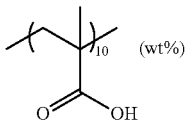
(Exemplary Compound 28)
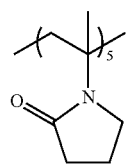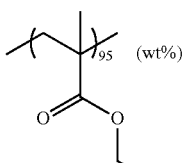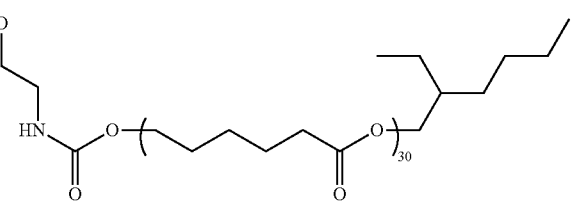
(Exemplary Compound 29)
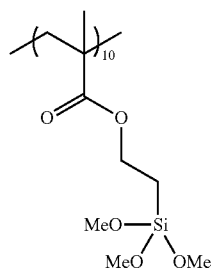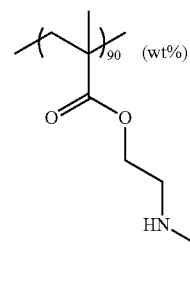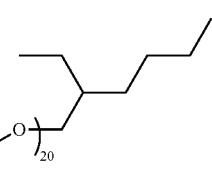
(Exemplary Compound 30)
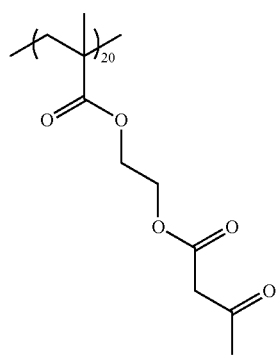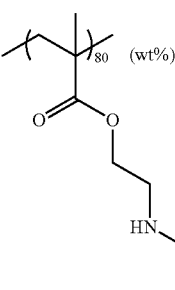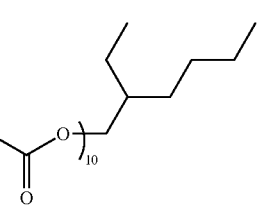
(Exemplary Compound 31)
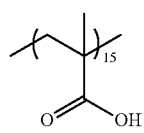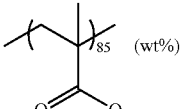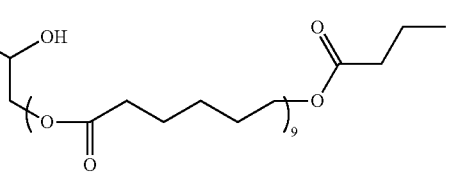

-continued
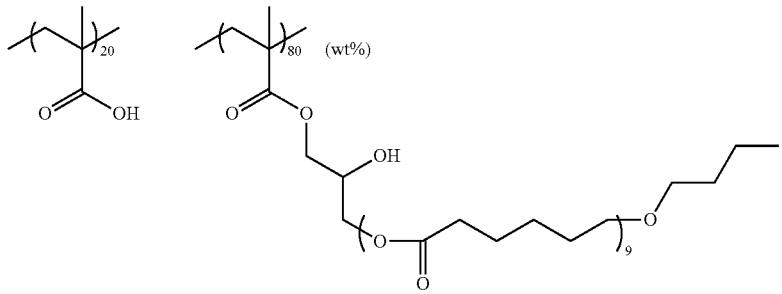
(Exemplary Compound 32)
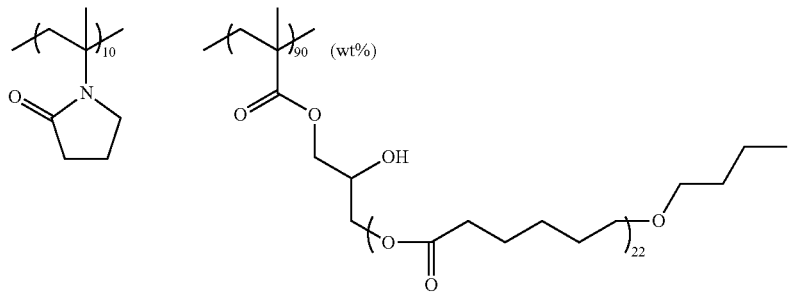
(Exemplary Compound 33)
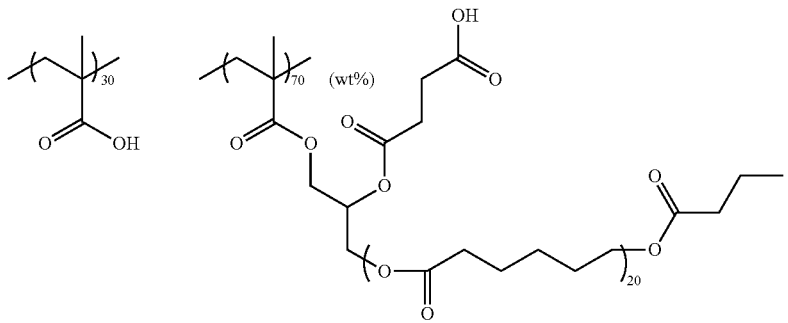
(Exemplary Compound 34)
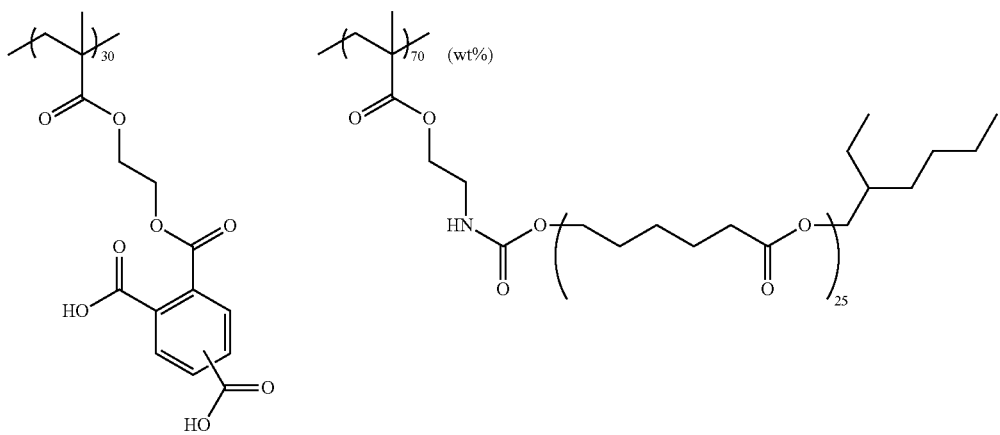
(Exemplary Compound 35)

(Exemplary Compound 36)
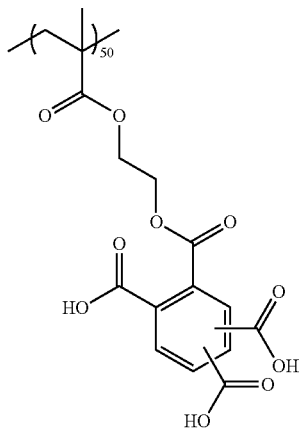 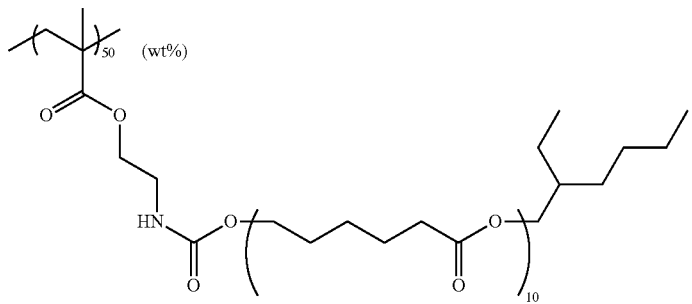
(Exemplary Compound 37)
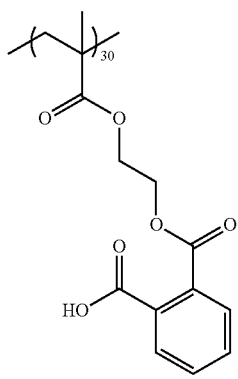 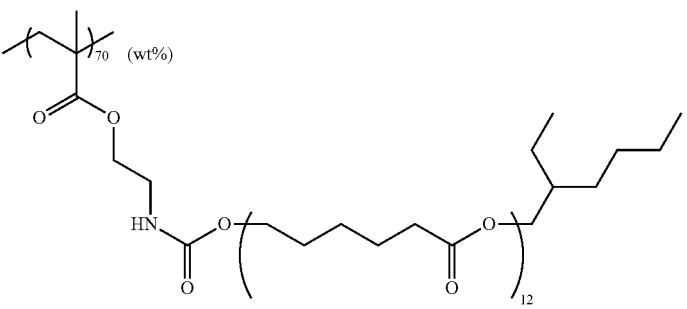
(Exemplary Compound 38)
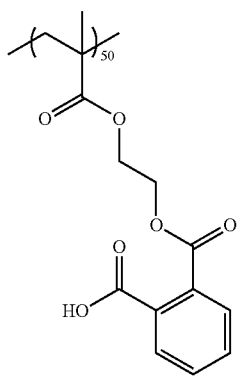 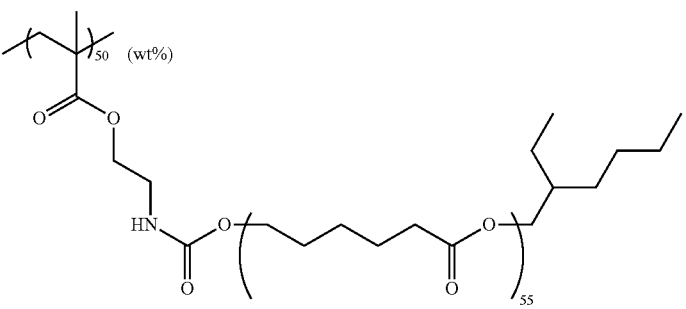
(Exemplary Compound 39)
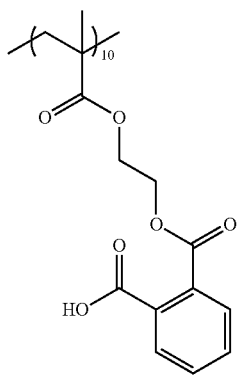 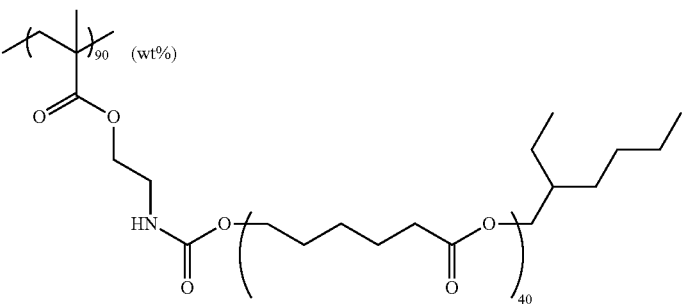

-continued
(Exemplary Compound 40)
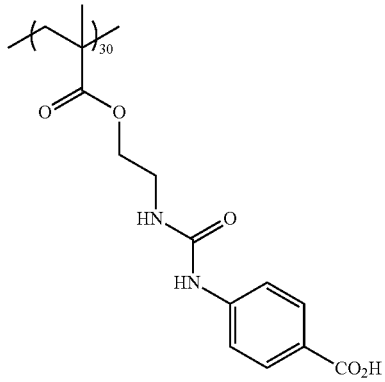
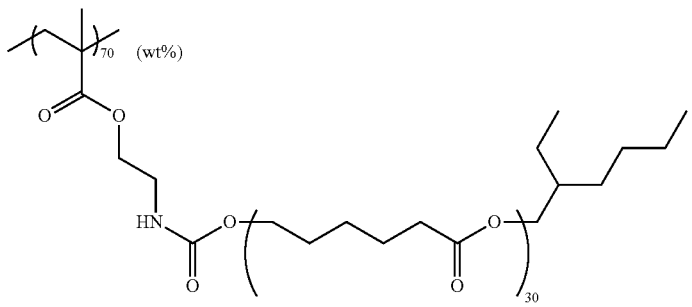
(Exemplary Compound 41)
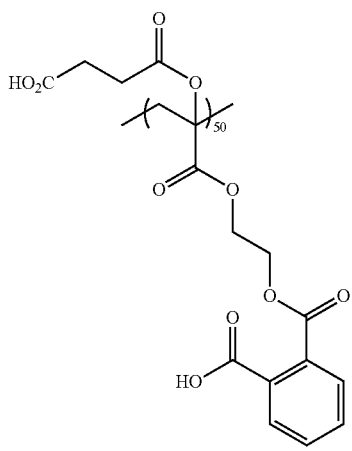
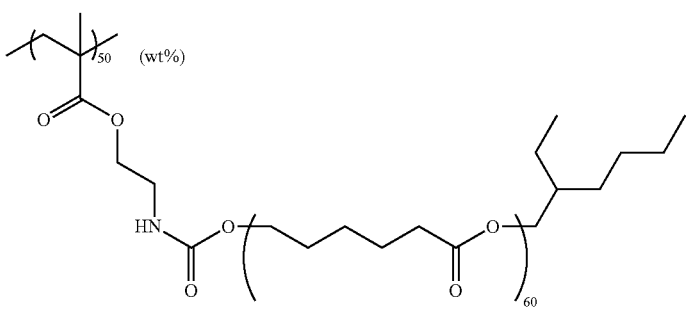
(Exemplary Compound 42)
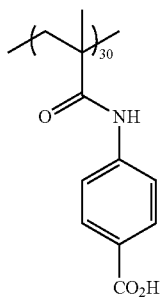
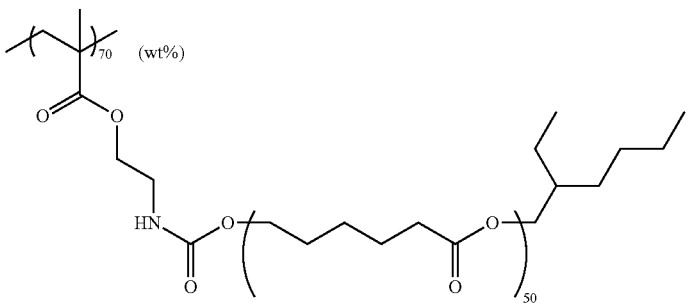

(Exemplary Compound 43)
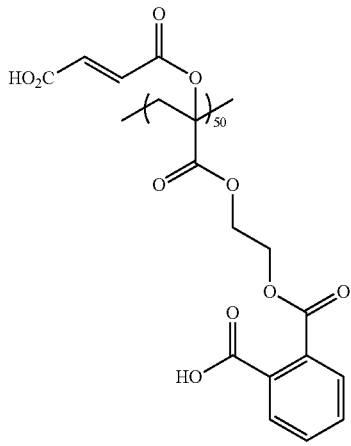 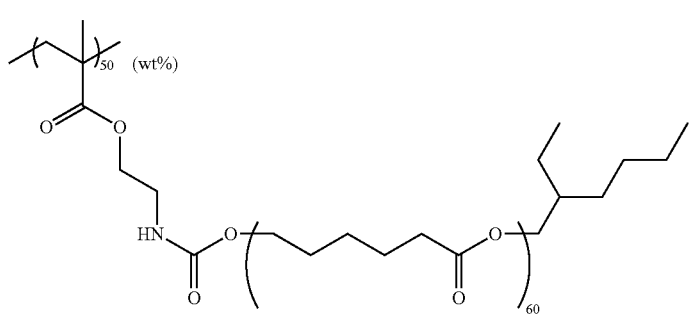
(Exemplary Compound 44)
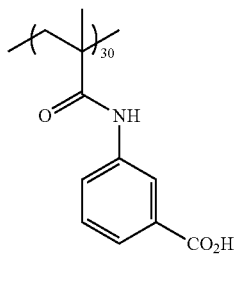 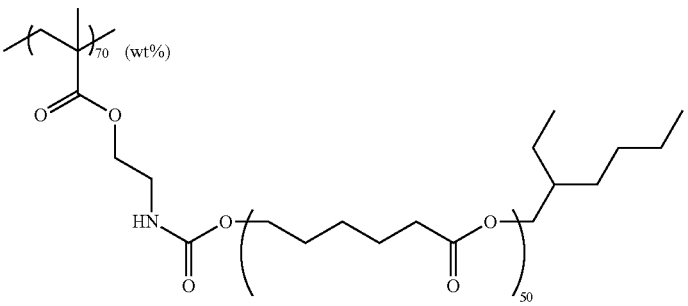
(Exemplary Compound 45)
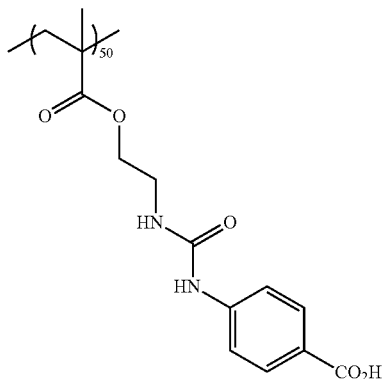 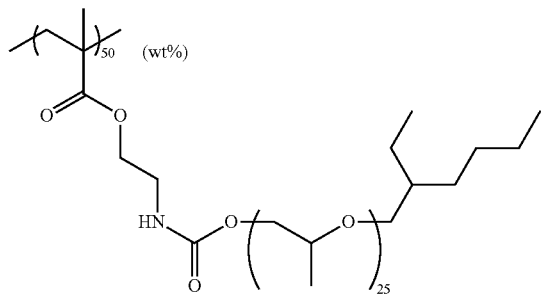
(Exemplary Compound 46)
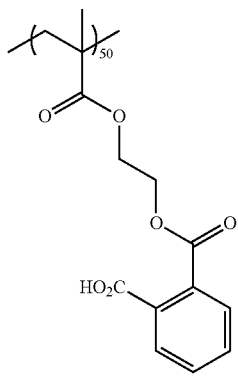 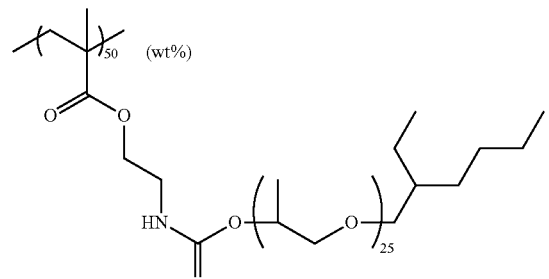

-continued
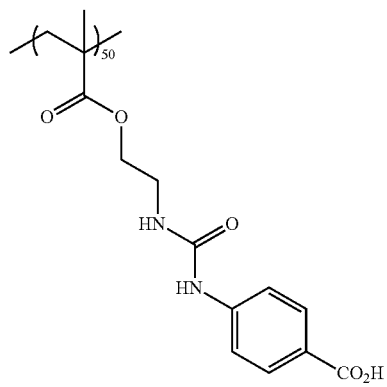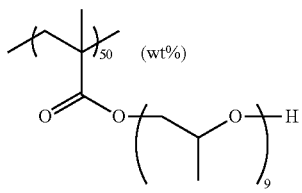
(Exemplary Compound 47)
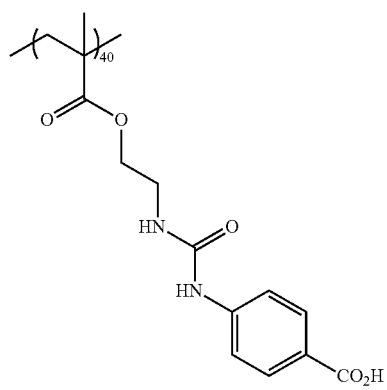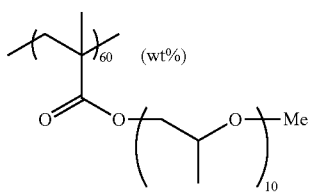
(Exemplary Compound 48)
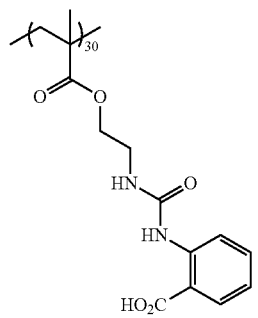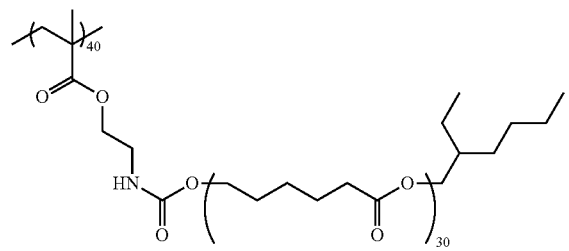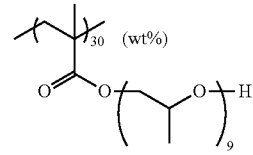
(Exemplary Compound 49)
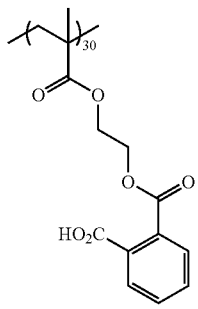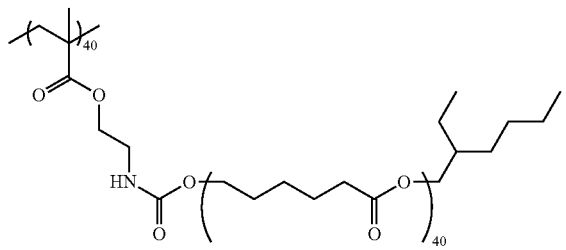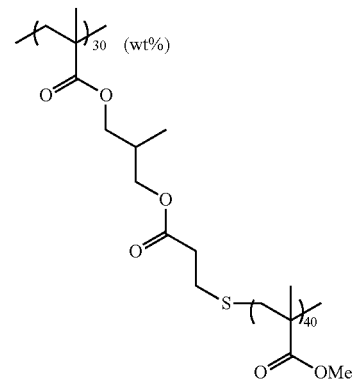
(Exemplary Compound 50)

-continued

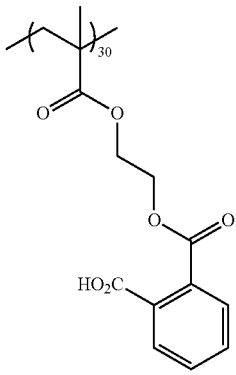

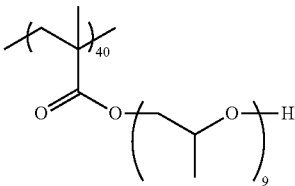

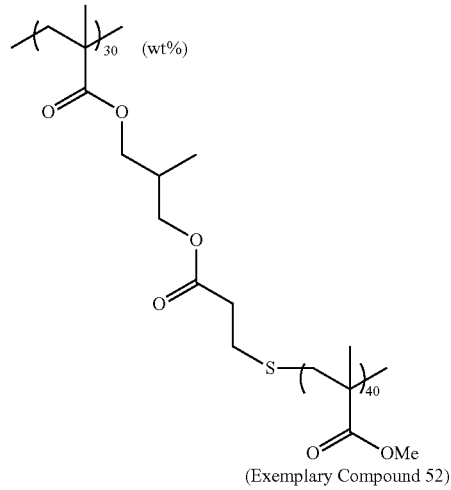

(Exemplary Compound 51)

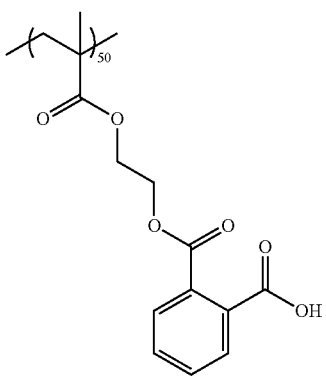

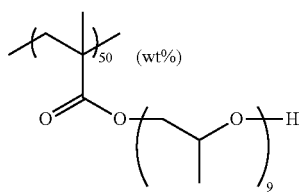

(Exemplary Compound 52)

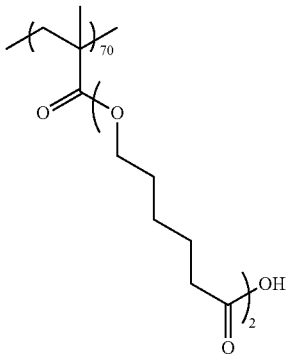

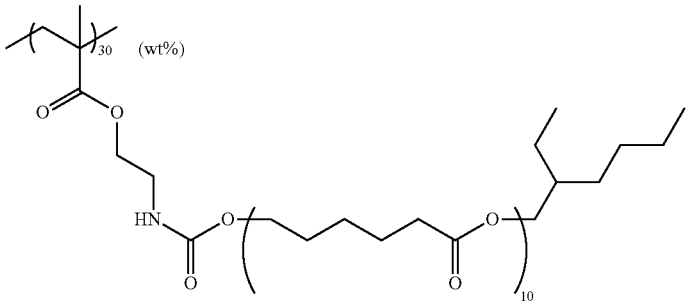

(Exemplary Compound 53)

Further, the dispersant in the invention has an effect of promoting adsorption of the dispersion resin by modification of the pigment surface.

In the invention, from the viewpoint of more effective prevention of the subsidence phenomenon of the black titanium pigment and drastic improvement of the dispersibility, a dispersant having an acid value of 50 mgKOH/g or more is preferable, and a dispersant having an acid value of 70 to 200 mgKOH/g is more preferable. If the dispersant has an acid value of 50 mgKOH/g or more, it is easily adsorbed on the surface of black titanium (and a pigment to be used in combination, if desired), and acts to prevent the re-aggregation. Further, a terminal-modified polymer and a block type polymer are preferable since they have an anchor site on the surface of a black titanium pigment, or a red, yellow, or orange color organic pigment.

Examples of the dispersant other than the graft copolymer include polymer dispersants such as a polyamidoamine and a salt thereof, a polycarboxylic acid and a salt thereof, a high molecular unsaturated acid ester, a modified polyurethane, a modified polyester, a modified poly(meth)acrylate, a (meth) acryl-based copolymer, a naphthalenesulfonic acid formalin condensate, a polyoxyethylene alkyl phosphate ester, a polyoxyethylenealkylamine, an alkanolamine, a pigment derivative, and the like. Specific examples of the dispersant which can be used in the invention include "DISPERBYK-101 (polyamidoamine salt phosphate), 107 (carboxylic acid ester), 110 (copolymer containing an acid group), 130 (polyamide), 161, 162, 163, 164, 165, 166, 170 (high molecular copolymer)", "BYK-P104, P105 (high molecular unsaturated polycarboxylic acid), manufactured by BYK Chemie, "EFKA4047, 4050, 4010, 4165 (polyurethane-based), EFKA4330, 4340 (block copolymer), 4400, 4402 (modified polyacrylate), 5010 (polyester amide), 5765 (high molecular polycarboxylate), 6220 (fatty acid polyester), 6745 (phthalocyanine derivative), 6750 (azo pigment derivative)" manufactured by EFKA, "AJISPUR PB821, PB822" manufactured by Ajinomoto Fine Techno Co., Inc., "FLOWLEN TG-710 (urethane oligomer)", "POLYFLOW No. 50E, No. 300 (acryl-based copolymer)", manufactured by Kyoeisha Chemical Co., Ltd., "DISPERON KS-860, 873SN, 874, #2150 (aliphatic polyvalent carboxylic acid), #7004 (polyetherester), DA-703-50, DA-705, DA-725" manufactured by Kusumoto Chemicals Ltd., "DEMOL RN, N (naphthalenesulfonic acid formalin polycondensate), MS, C, SN-B (aromatic sulfonic acid formalin polycondensate)", "HOMOGENOL L-18 (high molecular polycarboxylic acid)", "EMULGEN 920, 930, 935, 985, (polyoxyethylene nonyl phenyl ether)", "ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 17000, 27000 (polymer having functional site on a terminal), 24000, 28000, 32000, 38500 (graft polymer)" manufactured by The Lubrizol Corporation, "NIKKOL T106 (polyoxyethylene sorbitan monooleate), MYS-IEX (polyoxyethylene monostearate)" manufactured by Nikko Chemicals Co., Ltd., and the like. Further, examples of the amphoteric dispersant include amphoteric dispersants such as HINOACT T-8000E manufactured by Kawaken Fine Chemicals Co., Ltd., and the like.

These dispersants may be used singly or in combination of two or more kinds thereof.

The weight average molecular weight of the dispersant is from 10,000 to 300,000, preferably from 15,000 to 200,000, more preferably from 20,000 to 100,000, and particularly preferably from 25,000 to 50,000, from the viewpoint of inhibition of the pattern peeling upon development and the developability. Furthermore, the weight average molecular weight can be measured, for example, by means of GPC.

The content of the dispersant in the total solids of the colored composition for a light-shielding film of the invention is preferably in the range of 0.1 to 50% by mass, more preferably in the range of 5 to 40% by mass, and further preferably in the range of 10 to 30% by mass, from the viewpoint of dispersibility and dispersion stability.

—Solvent—

The colored composition for a light-shielding film of the invention can employ various organic solvents as a solvent.

Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, 2-heptanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethylsulfoxide, γ-butyrolactone, ethyl acetate, butyl acetate, methyl lactate, ethyl lactate, methyl 3-ethoxypropionate, ethyl 3-ethoxypropionate, ethyl cellosolve acetate, methyl 3-methoxypropionate, ethyl carbitol acetate, butyl carbitol acetate, and the like.

Two or more kinds of these organic solvents are preferably mixed. In this case, a mixed solution consisting of two or more kinds selected from the above methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol monomethyl ether, and propylene glycol monomethyl ether acetate are particularly preferable.

These solvents may be used either singly or in combination. The concentration of the solid content relative to the solvent is preferably from 2 to 60% by mass.

—Surfactant—

A variety of surfactants may be added to the colored composition for a light-shielding film of the invention from the viewpoint of improvement of coatability. As the surfactant, various surfactants such as a fluorine-based surfactant, a nonionic surfactant, a cationic surfactant, an anionic surfactant, a silicone-based surfactant, and the like can be used.

In particular, by incorporating a fluorine-based surfactant into the colored composition for a light-shielding film of the invention, the liquid characteristics (particularly, fluidity) in the case of preparation of a coating solution are improved, and thus, the uniformity after the coating and the decrease in the amount of the solution can be further improved.

That is, when a coating solution for which the colored composition for a light-shielding film containing a fluorine-based surfactant is used to form a film, the surface tension between the surface to be coated and the coating solution can be lowered so that the wettability on the surface to be coated is improved and the coatability on the surface to be coated is also improved. Therefore, even when a thin film having a thickness of approximately a few micrometers is formed with a small amount of the solution, the fluorine-based surfactant is effective in that a film having a uniform thickness with less thickness unevenness can be further favorably formed.

The fluorine content in the fluorine-based surfactant is preferably from 3% by mass to 40% by mass, more preferably from 5% by mass to 30% by mass, and particularly preferably from 7% by mass to 25% by mass. A fluorine-based surfactant having the fluorine content within the above range is effective in terms of the uniformity of the coating thickness and the decrease in the amount of the solution, and has good solubility in the colored photosensitive composition.

Examples of the fluorine-based surfactant include MEGAFAC F171, F172, F173, F176, F177, F141, F142, F143, F144, R30, F437, F475, F479, F482, F780, and F781 (all manufactured by DIC Corporation); FLUORAD FC430, FC431, and FC171 (all manufactured by Sumitomo 3M, Ltd.), SURFLON S-382, SC-101, SC-103, SC-104, SC-105, SC1068, SC-381, SC-383, S393, and KH-40 (all manufactured by Asahi Glass Co., Ltd.), SOLSPERSE 20000 (manufactured by the Lubrizol Corporation), and the like.

Specific examples of the nonionic surfactants include a glycerol, a trimethylolpropane, a trimethylolethane, and ethoxylates or propoxylates of them (for example, a glycerolpropoxylate, a glycerinethoxylate, and the like), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid esters (such as PLURONIC L10, L31, L61, L62, 10R5, 17R2 and 25R2, and TETRONIC 304, 701, 704, 901, 904 and 150R1, all manufactured by BASF SE), and the like.

Specific examples of the cationic surfactants include phthalocyanine derivatives (trade name: EFKA-745; manufactured by Morishita Chemical Industry Co., Ltd.), organosiloxane polymer KP341 (manufactured by Shin-Etsu Chemical Co., Ltd.), (meth)acrylic (co)polymers POLYFLOW No. 75, No. 90, and No. 95 (all manufactured by Kyoeisha Chemical Co., Ltd.), W001 (manufactured by Yusho Co., Ltd.), and the like.

Specific examples of the anionic surfactant include W004, W005, and W017 (all manufactured by Yusho Co., Ltd.).

Examples of the silicone-based surfactant include "TORAY SILICON DC3PA", "TORAY SILICON SH7PA", "TORAY SILICON DC11PA", "TORAY SILICON SH21PA", "TORAY SILICON SH28PA", "TORAY SILICON SH29PA", "TORAY SILICON SH30PA", and "TORAY SILICON SH8400" (all manufactured by Toray Dow Corning Silicone Co., Ltd.), "TSF-4440", "TSF-4300", "TSF-4445", "TSF-4460", and "TSF-4452" (all manufactured by Momentive Performance Materials Inc.), "KP341", "KF6001", and "KF6002" (all manufactured by Shin-Etsu Chemical Co., Ltd), "BYK307", "BYK323" and "BYK330" (all manufactured by BYK Japan K. K.), and the like.

The surfactants may be used singly or in combination of two or more kinds thereof.

The addition amount of the surfactant is preferably from 0.001% by mass to 2.0% by mass, and more preferably from 0.005% by mass to 1.0% by mass, relative to the total mass of the colored composition for a light-shielding film.

—Other Components—

The colored composition for a light-shielding film may contain the components such as a sensitizer, a co-sensitizer, a thermal polymerization inhibitor, an adhesion improving agent for improving the adhesion property with a hard surface such as a support and the like (a silane-based coupling agent, a titanium coupling agent, or the like), known additives such as an inorganic filler, a plasticizer, a sensitizer, and the like, for improving the physical properties of the cured film. Further, the colored composition for a light-shielding film can contain, if desired, various additives such as a chain transfer agent, a thermal polymerization initiator such as an azo-based compound, a peroxide-based compound, and the like, for enhancement of the curing level by post-heating after exposure or development, a thermal polymerization component, an ultraviolet ray absorber such as alkoxybenzophenon and the like, a plasticizer such as dioctyl phthalate and the like, a developability improving agent such as a low molecular weight organic carboxylic acid and the like, other fillers, a high molecular compound other than the above-described alkali-soluble resin, an oxidation inhibitor, an aggregation inhibitor, and the like, and a polyfunctional thiol or epoxy compound for the purpose of increasing the strength and sensitivity of a film.

The sensitizer is preferably one capable of sensitizing the above-mentioned photopolymerization initiator according to an electron transfer mechanism or an energy transfer mechanism. The sensitizer belongs to, for example, the compounds as mentioned below, examples of which include those having an absorption wavelength in a wavelength range from 300 to 450 nm. Specifically, they are, for example, polynuclear aromatics (for example, phenanthrene, anthracene, pyrene, perylene, triphenylene, 9,10-dialkoxyanthracene), xanthenes, thioxanthones, cyanines, merocyanines, phthalocyanines, thiazines, acridines, anthraquinones, squaliums, acridine oranges, coumarins, ketocoumarins, phenothiazines, phenazines, styrylbenzenes, azo compounds, diphenylmethanes, triphenylmethanes, distyrylbenzenes, carbazoles, porphyrins, spiro compounds, quinacridones, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone, Michler's ketone, and the like, heterocyclic compounds such as N-aryloxazolidinones, and the like, etc.

Further, the co-sensitizer further improves the sensitivity to the actinic radiation of the photopolymerization initiator or the sensitizer, or acts to inhibit the polymerization suppression of the photopolymerizable compound by oxygen, or the like. Examples of the co-sensitizer include amines (triethanol amine, ethyl p-dimethylaminobenzoic acid ester, p-formyldimethylaniline, p-methylthiodimethylaniline, and the like), thiols and sulfides (2-mercaptobenzothiazole, 2-mercaptobenzoxazole, 2-mercaptobenzoimidaimidazole, 2-mercapto-4(3H)-quinazoline, β-mercaptonaphthalene, and the like), amino acid compounds (examples: N-phenylglycine, and the like), organometallic compounds (examples: tributyltin acetate, and the like), hydrogen donors, sulfur compounds (examples: trithiane, and the like), etc.

Further, by adding the thermal polymerization inhibitor, it is possible to suppress unnecessary thermal polymerization of the photopolymerizable compound during production or storage of the composition. Examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (I) salt, and the like. Furthermore, in order to prevent polymerization suppression by oxygen, a higher fatty acid derivative such as behenic acid, behenamide, and the like may be added, if necessary, and the higher fatty acid derivative may be localized on the surface of a coating during drying after coating.

The colored composition for a light-shielding film of the invention can be suitably used for various applications such as an application in which a region other than a light-receiving region in the light-receiving element forming surface of a semiconductor substrate is light-shielded, an application in which the opposite side to light-receiving element forming surface of a semiconductor substrate is light-shielded, an application in which a region other than a light-transmitting section of a light-transmitting member disposed on the light-receiving surface side of a semiconductor substrate provided with a color filter and a light-receiving region such as a light-receiving element, etc., and the like, for example, in a solid-state image sensing device. In the case of light-shielding in a region other than the light-transmitting region of a light-transmitting member, a light-transmitting member is provided, for example, on a light-receiving element provided on a wafer, a color filter, and a microlens, and for a region other than the light-transmitting region at a wafer level, the colored composition for a light-shielding film of the invention is loaded by a coated film forming step as described below to carry out the exposure step and the pattern forming step, thereby forming a light-shielding pattern.

<Method for Forming Light-Shielding Film and Light-Shielding Pattern>

The light-shielding film (including a light-shielding pattern) of the invention includes at least one pigment selected from at least one selected from titanium atom-containing black titanium pigments and at least one organic pigment selected from the group consisting of a red organic pigment, a yellow organic pigment, a violet organic pigment, and an orange color organic pigment, and is configured to have a maximum value of the transmittance of light having a wavelength of 400 to 700 nm of 1.5% or less when a film is formed such that the light transmittance at a wavelength of 650 nm is 0.2%, have a wavelength exhibiting a maximum transmittance at 400 to 550 nm, and have a light transmittance at a wavelength of 400 nm of 0.1% or more.

The light-shielding film of the invention is preferably prepared by containing providing the colored composition for a light-shielding film on a support using the above-mentioned colored composition for a light-shielding film of the invention to form a colored film (hereinafter referred to as a "colored film forming step"), exposing the formed colored film in the pattern shape (hereinafter referred to as an "exposure step"), and developing the colored film after exposure to form a light-shielding pattern (hereinafter referred to as a "pattern forming step").

The color filter in the invention is excellent in light-shielding capability, and thus, even when the film is formed on a substrate having a structure, peeling is inhibited.

The thickness of the light-shielding film is not particularly limited, but from the viewpoint of obtaining the effect of the invention more effectively, it is preferably from 0.1 μm to 10 μm, more preferably from 0.3 μm to 5.0 μm, and particularly preferably from 0.5 μm to 3.0 μm. Further, the pattern size of the color filter is not particularly limited, but from the viewpoint of obtaining the effect of the invention more effectively, it is preferably 1000 μm or less, more preferably 500 μm or less, and particularly preferably 300 μm or less. The lower limit is preferably 1 μm.

The light-shielding film has a relationship that the maximum value of the transmittance of light having a wavelength of 400 to 700 nm is 1.5% or less when the light transmittance of light having a wavelength of 650 nm is 0.2%, the wavelength showing the maximum transmittance is from 400 to 550 nm, and the transmittance at a wavelength of 400 nm is 0.1% or more. The preferable transmittance is as described above.

Hereinbelow, each of the steps in the method for forming a light-shielding pattern in the invention will be described.

—Colored Film Forming Step—

In the colored film forming step, the colored composition for a light-shielding film of the invention is provided on a support to form a colored film. The colored composition for a light-shielding film can be provided by coating the colored composition for a light-shielding film to a desired support, discharging it by an ink-jet method, and the like.

Examples of the support include soda glass, borosilicate glass, and quartz glass used for a liquid crystal display element or the like, and those obtained by attaching a transparent conductive film thereto, a photoelectric conversion element substrate, for example, a silicone substrate, or the like, a complementary metal oxide film semiconductor (CMOS) substrate, and the like, used for an image sensing device or the like, etc. Further, the support can also be used for a backside irradiation element or the like. As the CMOS substrate or the like, those having a colored film formed on a protective film provided thereon are preferable, and examples of the protective film include inorganic films such as SiN, SiON, $SiO_2$, and the like. Further, on this support, if necessary, an undercoating layer may be provided in order to improve adhesion with a layer on the top, prevent diffusion of the materials, or flatten the substrate surface. In the light-shielding pattern and the method for forming the same in the invention, if a substrate having a structure (that is, a substrate having a pattern structure product formed thereon) is used as a support, the effect of inhibition of the peeling according to the invention is shown more effectively. The pattern structure may be various types of pattern structures such as a thin film transistor, a photoelectric conversion element, a passivation film, and the like, and may also be a colored pattern (for example, a red pattern, a green pattern, a blue pattern, a transparent pattern, and the like) which is preliminarily provided on a substrate before the color filter to be formed.

As the method for coating the colored composition for a light-shielding film of the invention on a support, various types of coating methods such as slit coating, an ink-jet method, spin coating, cast coating, roll coating, a screen printing method, and the like can be employed. The coated film thickness (dry film thickness) of the colored composition for a light-shielding film is preferably from 0.35 μm to 3.0 μm, and more preferably from 0.50 μm to 2.5 μm, from the viewpoint of resolution and developability.

The colored composition for a light-shielding film coated on the support is dried under the condition of usually 70° C. to 130° C. for about 2 minutes to 4 minutes to form a colored film.

—Exposure Step—

In the exposure step, the colored film formed in the coated film forming step is exposed in the pattern shape, for example, via a mask and cured (in the case of exposure via a mask, only the coated film part irradiated with light is cured).

Exposure is preferably carried out by irradiation with radiation, and as the radiation that can be used when carrying out exposure, in particular, an ultraviolet ray (preferably a wavelength region at 350 to 450 nm) such as a g-ray, an h-ray, an i-ray, and the like is preferably used, and a high pressure mercury lamp is more favorable. The irradiation intensity is preferably from 5 mJ to 3000 mJ, more preferably from 10 mJ to 2000 mJ, and most preferably from 10 mJ to 1000 mJ.

Exposure may be carried out in any one of a proximity mode, a mirror projection mode, and a stepper projection type exposure device mode, but it is particularly preferable to carry out exposure in a stepper projection type exposure device mode (stepper projection exposure mode using a stepper projection exposure device). The stepper projection type exposure device mode is to form a pattern by carrying out exposure while varying the exposure amount stepwise, and when the stepper projection type exposure device exposure is carried out, in particular, a property of giving a rectangular pattern can be improved.

Further, as the exposure device used in exposure with the stepper projection type exposure device, for example, an i-ray stepper projection type exposure device (product name: FPA-3000i5+, manufactured by Canon INC., and the like may be used.

—Pattern Forming Step—

Subsequently to the exposure step, the colored film after exposure is developed, for example, by an alkali development treatment to form a light-shielding pattern. In the pattern forming step, the non-irradiated part of the colored film in the exposure step is dissolved in an alkaline aqueous solution or the like and separated out to leave the irradiated part.

As a developer, an organic alkali developer that does not cause any damage to a circuit or the like on the base is desirable. The development temperature is usually 20° C. to 30° C., and the development time is 20 to 240 seconds.

Examples of the developer include an alkaline aqueous solution in which an organic alkaline compound is diluted with pure water so as to give a concentration of 0.001 to 10% by mass and preferably 0.01 to 1% by mass. As the organic alkali compound, for example, aqueous ammonia, ethylamine, diethylamine, dimethyl ethanolamine, tetramethylammonium hydroxide, tetraethylammonium hydroxide, choline, pyrrole, piperidine, 1,8-diazabicyclo-[5.4.0]-7-undecene, or the like can be used. Furthermore, if the alkaline aqueous solution is used as a developer, washing (rinsing) with pure water is generally carried out after developing.

In the method for forming a light-shielding pattern of the invention, in addition to the colored film forming step, the exposure step, and the pattern forming step, a curing step of curing by heating and/or exposing the pattern after development may be carried out, if necessary.

The light-shielding film of the invention is provided on a light-transmitting member disposed on the light-receiving surface side of a semiconductor substrate provided with at least a color filter and a light-receiving region to derive light in a part other than the light-transmitting region of the light-transmitting member, and thus, can act as a light-shielding film for controlling the light amount.

<Solid-State Image Sensing Device and Method for Producing the Same>

The solid-state image sensing device according to the first embodiment of the invention is configured to include the above-mentioned color filter of the invention. The solid-state image sensing device of the invention includes the color filter of the invention having superior light-shielding capability and little peeling, and therefore, its noise is reduced and its color reproducibility is thus excellent.

The constitution of the solid-state image sensing device of the invention is a constitution including the light-shielding film of the invention, and it is not particularly limited so long as it functions as a solid-state image sensing device. For example, the solid-state image sensing device has a light-receiving element composed of plural photodiodes, polysilicon, and the like which constitute the image-receiving area of the solid-stage image sensing device (a CCD image sensing device, a CMOS image sensing device, or the like) on a support, and has the light-shielding film of the invention on the light-receiving element forming side of the support (for example, a part other than the light-receiving section, a color adjusting section, or the like), or on the side opposite to that side.

Further, the solid-state image sensing device according to the second embodiment of the invention is configured to include:

a semiconductor substrate including plural light-receiving elements, an optical member disposed on the side facing each light-receiving element and having a light-collecting function for collecting light incident on the light-receiving element, a color filter disposed between the light-receiving element and the optical member, and a light-transmitting member which is provided on the side of the optical member not facing the color filter, has a light-shielding pattern (wherein light-shielding section) in at least a part of the regions other than the region facing the plural light-receiving element, which has at least one pigment selected from a titanium atom-containing black titanium pigment and at least one organic pigment selected from a red organic pigment, a yellow organic pigment, a violet organic pigment, and an orange color organic pigment, and which has the maximum value of the transmittance of light having a wavelength of 400 to 700 nm is 1.5% or less when the light transmittance of light having a wavelength of 650 nm is 0.2%, which has the wavelength showing the maximum transmittance is from 400 to 550 nm, and which has the light transmittance at a wavelength of 400 nm is 0.1% or more.

This light-transmitting member can be rendered to be a light-transmitting member having a light-shielding pattern formed by using the above-mentioned colored composition for a light-shielding film of the invention.

Since the solid-state image sensing device of the second embodiment includes a light-transmitting member having a light-shielding pattern formed by using the colored composition for a light-shielding film, it has superior light-shielding capability, good collection of the light amount and adjustment of the optical path, little peeling, and excellent color reproducibility.

The semiconductor substrate may be one including a support, a transfer electrode composed of plural photodiodes, polysilicon, and the like which constitute the image-receiving area of a CCD image sensing device (solid-stage image sensing device), a light-shielding film composed of tungsten and the like in which only the photodiodes and the light-receiving unit of the photodiode provided on the transfer electrode are open, and a device protective film composed of silicon nitride and the like, formed so as to cover the entire surface of the light-shielding film and the photodiode light-receiving section on the light-shielding film.

The optical member may be, for example, a microlens or the like, for collecting the incident light in a light-receiving area.

The light-transmitting member is an optical member disposed on the light-receiving surface side of a semiconductor substrate provided with a color filter and a light-receiving region such as a light-receiving element and the like, and it may be disposed, for example, on the structure provided with sequentially a photodiode (light-receiving element), a color filter, and a microlens in order from the wafer, on the wafer. This light-transmitting member may be configured to include a light-transmitting section for transmitting incident light (preferably a light-collecting means such as a lens member and the like, for collecting incident light), and a light-shielding pattern (light-shielding section) which is formed on a region except for the above light-transmitting section, includes a titanium atom-containing black titanium pigment and an organic pigment selected from a red organic pigment, a yellow organic pigment, a violet organic pigment, and an orange color organic pigment, have a maximum value of the transmittance of light having a wavelength of 400 to 700 nm of 1.5% or less when the light transmittance of light having a wavelength of 650 nm is 0.2%, have a wavelength showing the maximum transmittance at 400 to 550 nm, and have a light transmittance at a wavelength of 400 nm of 0.1% or more.

Figure 2:
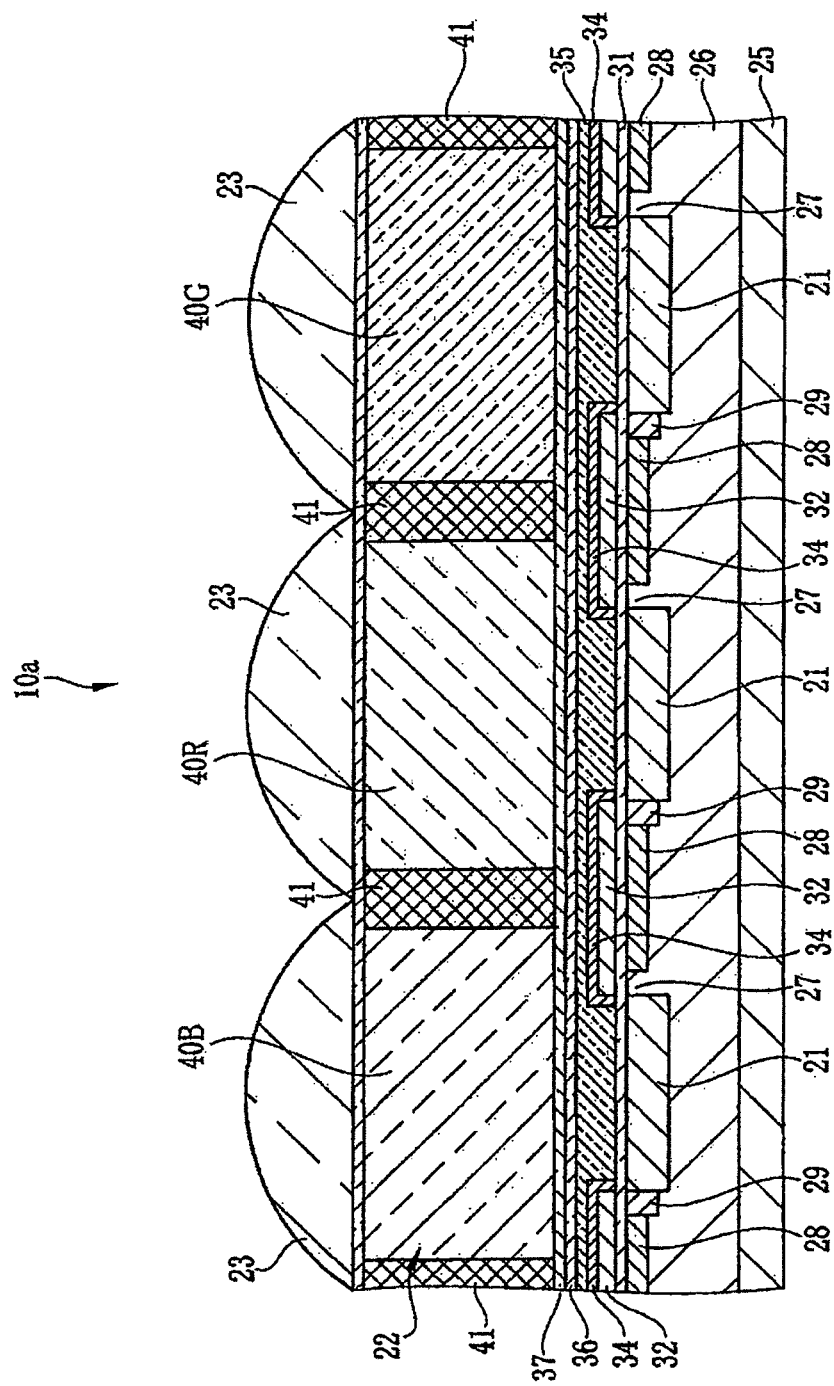
FIG. 2 is a schematic cross-sectional view showing the magnified image sensing unit of FIG. 1.

The constitution examples of the solid-state image sensing device are shown with reference to FIGS. 1 and 2. Furthermore, in FIGS. 1 to 2, to clarify each of the sections, the ratio between the thickness and width is disregarded and partly exaggerated.

As shown in FIG. 1, a solid-state image sensing device 9 is provided with a solid-state image sensing device 10 having a rectangular shape and a transparent cover glass 11 which is kept on the top of a solid-state image sensing device 10 and seals the solid-state image sensing device 10. Further, a lens layer 53 is superposed on the cover glass 11 via a spacer 21. The lens layer 53 is constituted with a support 51 and a lens material 52. The lens layer 53 may be configured to be formed by integration of the support 51 and the lens material 52. The substrate used as the support 51 is not particularly limited in its type, and soda glass, borosilicate glass, quartz glass, or the like, which is used for a liquid crystal display element or the like can be used. When stray light is incident on the peripheral region LS of the lens layer 51, the light-collecting effect is weakened in the lens material 52 by diffusion of light, and light reaching the imaging sensing unit 10a is reduced. Also, noise is generated by stray light. For this reason, the peripheral region LS of the lens layer 51 is provided with a light-shielding film 54 containing a black titanium pigment to carry out light-shielding.

The solid-state image sensing device 10 conducts photoelectric conversion of the optical image formed in the image sensing section 10a which is a light-receiving surface for output as an image signal. This solid-state image sensing device 10 includes a laminated substrate (support) 12 having two substrates. The laminated substrate 12 is composed of a tip substrate 12a in the rectangular shape and a circuit substrate 12b, each having the same size, in which the circuit substrate 12b is laminated on the backside of the tip substrate 12a.

The substrate used as the tip substrate 12a is not particularly limited in its type, and soda glass, borosilicate glass, and quartz glass used for a liquid crystal display element or the like, and those obtained by attaching a transparent conductive film thereto, a photoelectric conversion element substrate, for example, a silicone substrate, or the like, an oxidized film, silicon nitride, or the like is used.

The center of the surface of the tip substrate 12a is provided with the image sensing section 10a. Further, when stray light is incident on the peripheral region S of the image sensing section 10a, a dark current (noise) is generated from the circuit in the peripheral region S, and accordingly, this peripheral region S is provided with a light-shielding film 55 containing a black titanium pigment to carry out light-shielding. The edge of the surface of the tip substrate 12a is provided with plural electrode pads 17. The electrode pad 17 is electrically connected to the image sensing section 10a via a signal line (not shown) provided on the surface of the tip substrate 12a (possibly with a bonding wire).

The backside of the circuit substrate 12b is provided with each of the external connection terminals 18 on a substantially basic position of each of the electrode pads 17. Each of the external connection terminals 18 is connected to each of the electrode pads 17 via a penetrating electrode 19 which vertically penetrates through the laminated substrate 12. Further, each of the external connection terminals 18 is connected to a control circuit for controlling the drive of the solid-state image sensing device 10, an image processing circuit for subjecting the image sensing signal output from the solid-state image sensing device 10 to image processing, or the like via a wire (not shown).

As shown in FIG. 2, the image sensing section 10a is composed with the respective units such as the light-receiving element 21, the color filter 22, the microlens 23, and the like provided on the semiconductor substrate 25. The color filter 22 has a blue pixel 40B, a red pixel 40R, a green pixel 40G, and a black matrix 41.

As the semiconductor substrate 25, various known substrates such as a glass substrate used in a liquid crystal display device, a photoelectric conversion element substrate used in a solid-state image sensing device, and the like may be used, the same as for the above-mentioned tip substrate 12a. A p-well layer 26 is formed on the outer surface of the semiconductor substrate 25. In this p-well layer 26, the light-receiving element 21 composed of n-type layers, in which signal charges are produced and accumulated by photoelectric conversion, are formed as an array in the square grid shape.

On one side of the light-receiving element 21, a vertical transfer channel 28 composed of n-type layers is formed via a read gate section 27 on the outer surface of the p-well layer 26. Further, on the other side of the light-receiving element 21, a vertical transfer channel 28 belonging to the adjacent pixel is formed via an element separation region 29 composed of $p^+$ type layers. The read gate section 27 is a channel region for reading the signal charges accumulated in the light-receiving element 21 with the vertical transfer channel 28.

On the surface of the semiconductor substrate 25, a gate insulating film 31 composed of an ONO (Oxide-Nitride-Oxide) film is formed. On this gate insulating film 31, a vertical transfer electrode 32 composed of polysilicon or amorphous silicon is formed so as to cover a portion substantially above the vertical transfer channel 28, the read gate section 27, and the element separation region 29. The vertical transfer electrode 32 functions as a driving electrode which drives the vertical transfer channel 28 to perform charge transfer, and as a read electrode which drives the read gate section 27 to perform charge reading. The signal charges are transferred from the vertical transfer channel 28 to a horizontal transfer channel and an output section (floating diffusion amp), which are not shown, in this order and then output as voltage signals.

On the vertical transfer electrode 32, a light-shielding film 34 composed of tungsten and the like is formed so as to cover the surface. The light-shielding film 34 has an opening section immediately above the light-receiving element 21 to carry out light-shielding on the other regions. On the light-shielding film 34, a transparent intermediate layer consisting of an insulating film 35 composed of BPSG (borophospho silicate glass), an insulating film (passivation film) 36 composed of P—SiN, a lower flat film 37 composed of a transparent resin, etc., and the like is provided. The color filter 22 is formed on the intermediate layer.

The solid-state image sensing device of the third embodiment is one prepared by a method including coating the above-mentioned colored composition for a light-shielding film of the invention on the top of the light-transmitting member disposed on the light-receiving surface side of a semiconductor substrate provided with at least a color filter and a light-receiving region to form a coated film (a coated film forming step), exposing the coated film thus formed in the pattern shape (exposure step), developing the coated film after exposure to form a light-shielding pattern (pattern forming step), and separating the semiconductor substrate after formation of the light-shielding patter into predetermined element devices to form a solid-state image sensing device (hereinafter referred to as an "element forming step") (the method for producing the solid-state image sensing device of the invention).

In the solid-state image sensing device of the third embodiment, the light-shielding pattern formed on the light-transmitting member is excellent in light-shielding capability, and thus the peeling of the light-shielding pattern formed directly on a wafer at a wafer level is inhibited.

The coated film forming step, the exposure step, and the pattern forming step in the method for producing the solid-state image sensing device of the invention can be carried out in the similar manner to the method for forming the above-mentioned light-shielding pattern of the invention. Here, a light-shielding pattern having high light-shielding property is selectively formed in a region other than the light-transmitting section of the light-transmitting member, and thus light can be incident on the light-receiving region of the light-transmitting section at a predetermined light amount in an optical path.

In the third embodiment, since a light-shielding pattern is formed on the semiconductor substrate provided with at least a color filter and a light-receiving region such as a light-receiving element and the like at a wafer level, the semiconductor substrate on which the light-shielding pattern has been formed is separated into predetermined element devices by the element forming step to give an individual solid-state image sensing device.

EXAMPLES

While the present invention is described in more detail, the invention is by no means limited to the following examples unless they are beyond the spirit of the invention. "Parts" and "%" are based on parts and % by mass unless otherwise stated.

Example 1

<Synthesis of Dispersant>

600.0 g of ε-caprolactone and 22.8 g of 2-ethyl-1-hexanol were introduced into a 500-mL three-neck flask, and stirred and dissolved therein with injection of nitrogen. 0.1 g of monobutyltin oxide was added thereto, followed by heating at 100° C. After 8 hours, it was confirmed that the raw materials were lost by means of gas chromatography, and then the mixture was cooled to 80° C. 0.1 g of 2,6-di-t-butyl-4-methylphenol was added and then 27.2 g of 2-methacryloyloxyethyl isocyanate was added thereto. After 5 hours, it was confirmed that the raw materials were lost by means of $^1$H-NMR, and then the mixture was cooled to room temperature, thereby obtaining 200 g of a solid precursor M1 [the following structure]. It was found to be M1 as confirmed by means of $^1$H-NMR, IR, and mass spectrometry.

M1

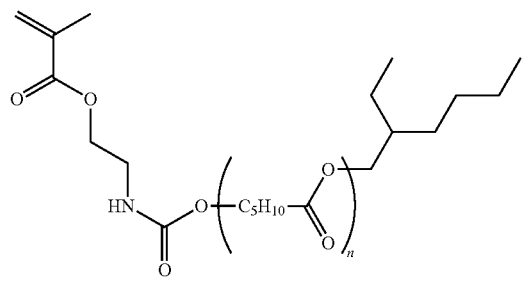

30.0 g of the precursor M1, 70.0 g of NKester CB-1, 2.3 g of dodecylmercaptan, and 233.3 g of propylene glycol monomethyl ether acetate were introduced into a three-neck flask which had been replaced by nitrogen, stirred with a stirring device (Shinto Scientific Co., Ltd.: three-one motor), and heated to 75° C. while dispensing nitrogen into the flask. To this, 0.2 g of dimethyl 2,2'-azobis(2-methylpropionate) ("V-601" manufactured by Wako Pure Chemical Industries, Ltd.) was added, followed by heating and stirring at 75° C. for 2 hours. After 2 hours, further 0.2 g of V-601 was added thereto, followed by heating and stirring for 3 hours, thereby obtaining a 30% solution of the following dispersant 1.

The compositional ratio of the dispersant 1 was as follows: x=35% by mass and y=65% by mass, and the acid value and the weight average molecular weight (Mw) of the dispersant 1 were 80 mgKOH/g and 31000, respectively.

Furthermore, the weight average molecular weight is a value obtained by measurement using gel permeation chromatography (GPC) and determination using polystyrene as a standard. The GPC was measured by means of HLC-8020 GPC (manufactured by TOSOH CORPORATION) using TSKgel SuperHZM-H, TSKgel SuperHZ4000, and TSKgel SuperHZ200 (manufactured by TOSOH CORPORATION) as the columns.

DISPERSANT 1

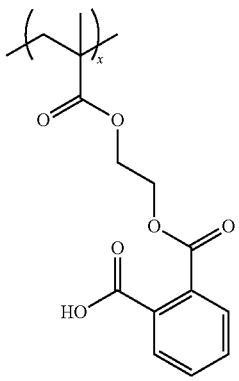
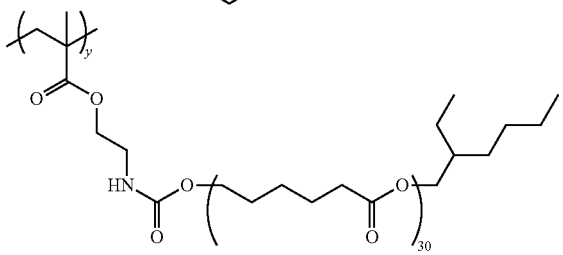

<Preparation of Pigment Dispersion>

All the components in the following composition were mixed and stirred for 3 hours under the condition of a rotation speed of 3000 rpm using a homogenizer, thereby giving a mixed solution. The content ratios of the black titanium and the red organic pigment are shown in Table 1 or Table 2 below.

<Composition>

| | |
|---|---|
| Black titanium (13 M-T, manufactured by Mitsubishi Materials Corporation; black titanium pigment) | 25 parts |
| Red organic pigment (IrgazinDPP Red BTR, manufactured by Ciba Specialty Chemicals; diketopyrrolopyrrole-based pigment) | 8.4 parts |
| Dispersant 1 above | 11.3 parts |
| Propylene glycol monomethyl ether acetate | 55.3 parts |

For the mixed solution thus obtained, dispersion treatment was initiated using ULTRA APEX MILL UAM015 manufactured by KOTOBUKI INDUSTRIES CO., LTD as the dispersion device (bead mill).

<Dispersion Condition>

Bead diameter: φ0.05 mm
Bead filling rate: 75% by volume
Mill peripheral speed: 12 msec
Amount of mixed liquid for dispersion treatment: 680 g
Circulation flow rate (pump feed amount): 13 kg/hour
Temperature of treatment liquid: 25 to 30° C.
Cooling water: tap water
Inner volume of bead mill annular passage: 0.15 L After the initiation of dispersion, volume average particle diameters were measured at a 30 minute interval (time for one pass) while carrying out a dispersion treatment under the above-described condition. In this regard, the volume average particle diameter was decreased with the dispersion time (pass times), but the variation amounts were gradually decreased. Further, at a time point in which the change in the volume average particle diameter per one pass when the dispersion time was increased by 30 minutes became 10 nm or less (that is, a time point in which the change in the volume average particle diameter became 10 nm/pass or less; the procedure hereinbefore is a dispersion treatment at a "first stage"), 120 g of a solution of the dispersant 1 to be described below in propylene glycol monomethyl ether acetate was added to the dispersion.

<Composition>

| Dispersant 1 above | 30 parts |
|---|---|
| Propylene glycol monomethyl ether acetate | 70 parts |

After addition of the solution (dispersant), dispersion treatment was further continued for 10 passes, and a black titanium dispersion was completed at a time when the change in the volume average particle diameter per pass (for 30 minutes) returned to 10 nm or less (the procedure hereinbefore is a dispersion treatment at a "second stage"), whereby a pigment dispersion was prepared.

<Preparation of Photosensitive Resin Composition>

By mixing the following compositions, a photosensitive resin composition (colored composition for a light-shielding film) was prepared.

<Composition of Photosensitive Resin Composition>

| Pigment dispersion above | 50 parts |
|---|---|
| Dipentaerythritol hexaacrylate (T-1 below) | 8 parts |
| Oxime-based photopolymerization initiator (K-1 below) | 5 parts |
| Resin (J-1 below; the weight average molecular weight Mw is shown below) | 10 parts |
| Propylene glycol monomethyl ether acetate | 27 parts |

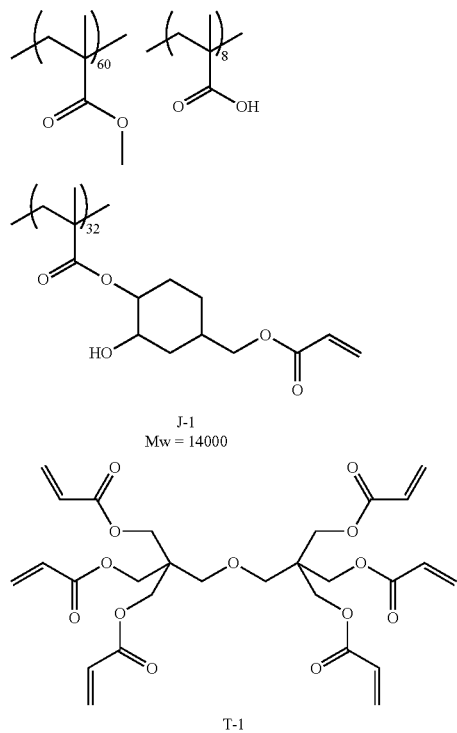

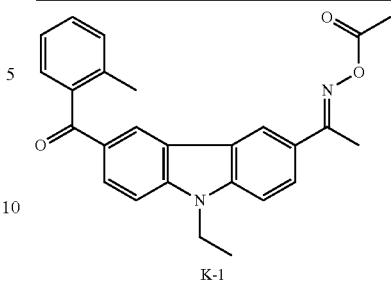

K-1

<Preparation of Color Filter>

A 6-inch silicon wafer and a glass substrate (Corning 1737) were prepared, and the colored composition for a light-shielding film obtained above was coated respectively on the silicon wafer or the glass substrate by a spin coating method, and heated at 120° C. for 2 minutes in a hot plate to form a colored film. Then, this colored film was subjected to exposure using a proximity mode exposure device via a photomask in the 100-μm grid shape at an exposure amount of 400 mJ/cm$^2$ (illumination 50 mW/cm$^2$). The colored film after exposure was made still for 60 seconds by covering it with a 0.3% aqueous tetramethylammonium hydroxide solution at 23° C. After the film was made still, it was sprayed with pure water on the shower with a rotary nozzle, rinsed off with a 0.3% aqueous tetramethylammonium hydroxide solution, and further washed with pure water to obtain a light-shielding pattern having a size of a 100-μm grid.

<Evaluations>

The following evaluations were conducted on the light-shielding pattern formed on the silicon wafer or the glass substrate. The evaluation results are shown in Table 1 or Table 2 below.

(2.1) Shape and Peeling of Light-Shielding Pattern

A cut section obtained by cutting the light-shielding pattern formed on the glass substrate or the silicon wafer in the direction perpendicular to the film surface was observed using SEM (S-4800H, manufactured by Hitachi High-Technologies Corporation) at 20,000× magnification, and the shape and the presence or absence of the peeling of the cut section were evaluated according to the following evaluation criteria. Furthermore, when the shape of the cut section was reverse-tapered and forward-tapered, the light-shielding property of the light-shielding pattern is not uniform and the contrast of the display image is damaged, thereby deteriorating the performance of the device.

<Evaluation Criteria>

A: There was no peeling and the cut section was rectangular.

B: Slight peeling was seen and the cut section was somewhat forward-tapered, but in a practically acceptable range.

C: Peeling was seen in some places and the cut section was reverse-tapered.

D: There was no peeling, but the cut section was apparently reverse-tapered.

E: Peeling was seen on all sides and the cut section was also reverse-tapered.

(2.2) Transmittance

Using the colored composition for a light-shielding film obtained above, the film thickness was adjusted so as to give a light transmittance at a wavelength of 650 nm of the light-shielding film formed on a glass substrate (Corning 1737) of 0.2% under the same condition as the case of preparation of the color filter, except that exposure was carried out on all sides, not via a photomask, thereby forming a light-shielding film. The maximum transmittance (%) at a wavelength of 400 to 700 nm and the wavelength showing the maximum transmittance (nm) of the formed light-shielding film were measured using U-4100 [manufactured by Hitachi High-Technologies Corporation].

(2.3) Noise

As shown in FIG. 1, a light-shielding pattern was formed on the peripheral region S of the image sensing section 10a on the silicon wafer and/or the peripheral region LS of the lens layer 53 on the glass substrate, the solid-state image sensing device was driven, and the presence or absence of the effect by the noise was evaluated according to the following evaluation criteria.

<Evaluation Criteria>

A: There was little inhibition of noise, and thus the effect was not seen on the device.

B: A slight effect due to the noise was seen but in a practically acceptable range.

C: The noise reduction had little effect and influenced the device operation.

Examples 2 to 15 and Comparative Examples 1 to 4

In the same manner as in Example 1 except that the types, ratios, and the like of the red organic pigments used for preparation of the pigment dispersions in Example 1 were changed into those as shown in Table 1 or Table 2 below, a color filter was prepared and evaluated. The evaluation results are shown in Table 1 or Table 2 below.

TABLE 1

| | Black | Organic pigment | | | Ratio of TiB and organic pigment (*4) | |
|---|---|---|---|---|---|---|
| | | | | | Mass ratio | Mass ratio |
| | Ti pigment | Type | Pigment No. (*4) | Product name | in total solids | in total pigment |
| Ex. 1 | Titanium black | Diketopyrrolopyrrole-based | PR254 | Irgazin DPP Red BTR (*1) | 25/8.4 | 75/25 |
| Ex. 2 | | Diketopyrrolopyrrole-based | PO71 | Cromophtal DPP Orange TR (*1) | 25/8.4 | 75/25 |
| Ex. 3 | | Perylene-based | PR179 | Hostaperm Red P2GL (*2) | 25/8.4 | 75/25 |
| Ex. 4 | | Perylene-based | PR224 | Hostaperm Red P3GL (*2) | 25/8.4 | 75/25 |
| Ex. 5 | | Benzimidazolone-based | PO36 | Novoperm Orange HL71 (*2) | 25/8.4 | 75/25 |
| Ex. 6 | | Benzimidazolone-based | PO64 | Cromophtal Orange GP (*1) | 25/8.4 | 75/25 |
| Ex. 7 | | Perinone-based | PO43 | Hostaperm Orange GR (*2) | 25/8.4 | 75/25 |
| Ex. 8 | | NaphtholAS-based | PO38 | Graphtal Red HFG (*2) | 25/8.4 | 75/25 |
| Ex. 9 | | Anthraquinone-based | PR177 | Cromophtal Red A3B (*1) | 25/8.4 | 75/25 |
| Ex. 10 | | Isoindolinone-based | PY139 | Novoperm Yellow P-M3R VP2350 (*2) | 25/8.4 | 75/25 |

| | Transmittance at wavelength of 400 to 700 nm | | Wave length 400 nm | Pattern | | |
|---|---|---|---|---|---|---|
| | Maximum transmittance (%) | Wave-length at the moment (nm) | Transmittance (%) | Shape/peeling | | Device noise |
| | | | | Glass substrate | Silicon wafer | |
| Ex. 1 | 0.81 | 435 | 0.40 | A | A | A low |
| Ex. 2 | 0.75 | 420 | 0.35 | A | A | A low |
| Ex. 3 | 0.81 | 440 | 0.43 | A | A | A low |
| Ex. 4 | 0.70 | 420 | 0.45 | A | A | A low |
| Ex. 5 | 0.52 | 535 | 0.37 | A | A | A low |
| Ex. 6 | 0.52 | 420 | 0.42 | A | A | A low |
| Ex. 7 | 0.72 | 435 | 0.30 | A | A | A low |
| Ex. 8 | 0.65 | 435 | 0.35 | A | A | A low |
| Ex. 9 | 0.61 | 435 | 0.47 | A | A | A low |
| Ex. 10 | 1.48 | 525 | 0.12 | B | B | B acceptable |

(*1): manufactured by Ciba Specialty Chemicals Co., Ltd,
(*2): manufactured by Clariant International Ltd.,
(*3): manufactured by BASF AG
(*4): TiB: Titanium black, PR: Pigment Red, PO: Pigment Orange PY: Pigment Yellow, PV: Pigment Violet, PB: Pigment Black

TABLE 2

| | Black Ti pigment | Organic pigment | | | Ratio of TiB and organic pigment (*4) | |
|---|---|---|---|---|---|---|
| | | Type | Pigment No. (*4) | Product name | Mass ratio in total solids | Mass ratio in total pigment |
| Ex. 11 | Titanium black | Pyrazolone-based | PO34 | Irgalite Orange F2G (*1) | 25/8.4 | 75/25 |
| Ex. 12 | | Benzimidazolone-based | PO62 | Novoperm Orange H5G 70 (*2) | 25/8.4 | 75/25 |
| Ex. 13 | | Perylene-based | PV29 | Irgazin Violet 129 (*1) | 25/8.4 | 75/25 |
| Ex. 14 | | Diketopyrrolopyrrole-based | PR254 | Irgazin DPP Red BTR (*1) | 29/5 | 85/15 |
| Ex. 15 | | Perylene-based | PV29 | Irgazin Violet 129 (*1) | 29/5 | 85/15 |
| Comp. Ex. 1 | Titanium black | | — | | 34/0 | 100/0 |
| Comp. Ex. 2 | — | Perylene-based | PB31 | Paliogen Black S 0084 (*3) | 25/8.4 | 75/25 |
| Comp. Ex. 3 | Titanium black | Diketopyr-rolopyrrole-based | PR254 | Irgazin DPP Red BTR (*1) | 32/2 | 95/5 |
| Comp. Ex. 4 | Titanium black | Diketopyr-rolopyrrole-based | PR254 | Irgazin DPP Red BTR (*1) | 12/22 | 35/65 |

| | Transmittance at wavelength of 400 to 700 nm | | Wave length 400 nm | Pattern Shape/peeling | | |
|---|---|---|---|---|---|---|
| | Maximum transmittance (%) | Wave-length at the moment (nm) | Trans-mittance (%) | Glass substrate | Silicon wafer | Device noise |
| Ex. 11 | 0.52 | 425 | 0.27 | A | A | A low |
| Ex. 12 | 0.55 | 430 | 0.39 | A | A | A low |
| Ex. 13 | 1.4 | 430 | 0.75 | A | A | A low |
| Ex. 14 | 1.2 | 440 | 0.50 | A | A | B acceptable |
| Ex. 15 | 1.0 | 430 | 0.60 | A | A | B acceptable |
| Comp. Ex. 1 | 3.0 | 465 | 0.90 | D | D | C high |
| Comp. Ex. 2 | 0.35 | 590 | 0.01 | E | E | Not formable |
| Comp. Ex. 3 | 1.8 | 440 | 0.70 | A | A | C high |
| Comp. Ex. 4 | 0.6 | 560 | 0.08 | C | C | B acceptable |

(*1): manufactured by Ciba Specialty Chemicals Co., Ltd,
(*2): manufactured by Clariant International Ltd.,
(*3): manufactured by BASF AG
(*4): TiB: Titanium black, PR: Pigment Red, PO: Pigment Orange PY: Pigment Yellow, PV: Pigment Violet, PB: Pigment Black As seen from Table 1 or Table 2, when a light-shielding pattern was directly formed at a wafer level on a glass substrate (light-transmitting member) such as a so-called wafer level lens disposed on the light-receiving surface side of the semiconductor substrate provided with a color filter and a light-receiving element, in Examples, the light transmittance at a wavelength of 400 to 700 nm was slightly inhibited, while the light transmittance was maintained in a short-wavelength region at a wavelength of 400 nm. Further, the formed light-shielding pattern was capable of being obtained as a light-shielding pattern in which the cross-sectional shape was rectangular without generation of peeling. That is, as seen in FIG. 1, the light-shielding film could be applied on any one of the peripheral region S of the image sensing section 10a on the silicon wafer and the peripheral region LS of the lens layer 53 on the glass substrate. Also when the film was formed on the silicon wafer, a light-shielding pattern having a rectangular cross-sectional shape without generation of peeling could be obtained in the similar manner to the case where the light-shielding pattern was directly formed on glass substrate (light-transmitting member) at a wafer level. As a result, in the solid-state image sensing device in which the light-shielding film was formed on the peripheral region S of the image sensing section 10a on the silicon wafer and the peripheral region LS of the lens layer 53 on the glass substrate, the device noise was slightly inhibited. Further, also when the light-shielding film was formed on any one of the peripheral region S of the image sensing section 10a on the silicon wafer and the peripheral region LS of the lens layer 53 on the glass substrate, the same effect of reduction in the device noise could be attained.

In contrast, in Comparative Examples, the cross-sectional shape was tilted-tapered, and thus peeling could not be prevented. Therefore, the noise of the prepared solid-state image sensing device was not slightly inhibited.

Hereinafter exemplary embodiments of the invention related to the first aspect will be described. However, the invention is not limited to the following embodiments.

<1> A colored composition for a light-shielding film including at least one pigment selected from titanium atom-containing black titanium pigments and at least one organic pigment selected from the group consisting of a red organic pigment, a yellow organic pigment, a violet organic pigment, and an orange color organic pigment, wherein the colored composition has a maximum value of the transmittance of light having a wavelength of 400 to 700 nm of 1.5% or less when a film is formed such that the light transmittance at a wavelength of 650 nm is 0.2%, has a wavelength exhibiting g the maximum transmittance at 400 to 550 nm, and has a light transmittance at a wavelength of 400 nm of 0.1% or more.

<2> The colored composition for a light-shielding film as described in <1> above, wherein a mass ratio (tip:orp) of the black titanium pigment (tip) and the organic pigment (orp) is from 90:10 to 40:60.

<3> The colored composition for a light-shielding film as described in <2> above, wherein a content of the black titanium pigment is 20% by mass or more relative to a total solids mass of the colored composition.

<4> The colored composition for a light-shielding film as described in <2> or <3> above, wherein a content of the black titanium pigment is 35% by mass or more relative to a total mass of pigment.

<5> The colored composition for a light-shielding film as described in any one of <1> to <4> above, wherein at least one of the organic pigments is a diketopyrrolopyrrole-based pigment, a perylene-based pigment, a benzimidazolone-based pigment, a perinone-based pigment, a naphthol AS-based pigment, an anthraquinone-based pigment, a pyrazolone-based pigment, or an isoindolinone-based pigment.

<6> The colored composition for a light-shielding film as described in any one of <1> to <5> above, which is photo-curable and further has a resin, a polymerizable compound, and a photopolymerization initiator.

<7> The colored composition for a light-shielding film as described in <6> above, which is used for preparation of a color filter for a solid-state image sensing device.

<8> The colored composition for a light-shielding film as described in any one of <1> to <7> above, wherein the content of the total pigments including the black titanium pigment and the organic pigment is from 15 to 60% by mass relative to a total solid content of the colored composition.

<9> The colored composition for a light-shielding film as described in <6> or <7> above, wherein the resin is a resin having an acryloyl group or a methacryloyl group.

<10> The colored composition for a light-shielding film as described in <6> or <7> above, wherein the photopolymerization initiator is an oxime-based photopolymerization initiator.

<11> The colored composition for a light-shielding film as described in any one of <1> to <10> above, which further includes a dispersant having an acid value of 50 mgKOH/g or more.

<12> A method for forming a light-shielding pattern, including, providing the colored composition for a light-shielding film as described in any one of <6> to <11> above on a support to form a colored film, exposing the colored film in a pattern shape, and developing the colored film after exposure to form a light-shielding pattern.

<13> A light-shielding film including at least one pigment selected from titanium atom-containing black titanium pigments and at least one organic pigment selected from the group consisting of a red organic pigment, a yellow organic pigment, a violet organic pigment, and an orange color organic pigment, wherein the light-shielding film has a maximum value of the transmittance of light having a wavelength of 400 to 700 nm of 1.5% or less when the light transmittance of light having a wavelength of 650 nm is 0.2%, has a wavelength exhibiting a maximum transmittance at 400 to 550 nm, and has a light transmittance at a wavelength of 400 nm of 0.1% or more.

<14> A light-shielding film formed by the method for forming a light-shielding pattern as described in <12> above.

<15> A method for producing a solid-state image sensing device including providing the colored composition for a light-shielding film described in any one of <6> to <11> above on a light-transmitting member disposed on the light-receiving surface side of a semiconductor substrate provided with at least a color filter and a light-receiving region to form a colored film, exposing the formed colored film in a pattern shape, developing the colored film after exposure to form a light-shielding pattern, and separating the semiconductor substrate after formation of the light-shielding pattern into predetermined element to prepare a solid-state image sensing device.

<16> A solid-state image sensing device including a semiconductor substrate including plural light-receiving elements, an optical member which is disposed facing each light-receiving element and has a light-collecting function for collecting light incident on the light-receiving elements, a color filter which is disposed between the light-receiving elements and the optical member, and a light-transmitting member which is provided on the side of the optical member not facing the color filter, has a light-shielding pattern in at least a part of the regions other than the region facing the plurality of light-receiving elements, the light-shielding pattern having at least one pigment selected from titanium atom-containing black titanium pigments and at least one organic pigment selected from a red organic pigment, a yellow organic pigment, a violet organic pigment, and an orange color organic pigment, wherein the light-shielding pattern has a maximum value of the transmittance of light having a wavelength of 400 to 700 nm of 1.5% or less when the light transmittance of light having a wavelength of 650 nm is 0.2%, has the wavelength exhibiting the maximum transmittance at from 400 to 550 nm, and has the light transmittance at a wavelength of 400 nm of 0.1% or more.

<17> A solid-state image sensing device including the light-shielding film as described in <13> or <14> above.

According to the invention, a colored composition for a light-shielding film which maintains light-transmitting in a short-wavelength region (for example, less than 400 nm), has high light-shielding property (that is, black density) in the infrared region and visible region (for example, 400 to 700 nm), and inhibits the generation of peeling on a substrate having a structure is provided.

Further, according to the invention, a light-shielding pattern having excellent light-shielding capability and little peeling, and a method for forming the same is provided.

Further, according to the invention, a solid-state image sensing device having little noise and excellent color reproducibility, and a method for producing the same is prepared.

The entire disclosure of the Japanese patent Application Nos. 2009-160703 and 2009-187166 is incorporated by reference herein.

The foregoing description of the embodiments of the invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A colored composition for a light-shielding film, comprising at least one pigment selected from titanium atom-containing black titanium pigments and at least one organic pigment selected from the group consisting of a red organic pigment, a yellow organic pigment, a violet organic pigment, and an orange color organic pigment,
   wherein, when the colored composition is formed into a film such that a transmittance of light having a wavelength of 650 nm of the film is 0.2%, the film has a maximum value of transmittance of light having a wavelength of 400 to 700 nm of 1.5% or less; has a wavelength exhibiting the maximum value of transmittance in the range of 400 to 550 nm; and has a transmittance of light having a wavelength of 400 nm of 0.1% or more.

2. The colored composition for a light-shielding film according to claim 1, wherein the mass ratio (tip:orp) of the black titanium pigment (tip) and the organic pigment (orp) is from 90:10 to 40:60.

3. The colored composition for a light-shielding film according to claim 2, wherein the content of the black titanium pigment is 20% by mass or more relative to the total solids mass of the colored composition.

4. The colored composition for a light-shielding film according to claim 2, wherein the content of the black titanium pigment is 35% by mass or more relative to the total mass of pigment.

5. The colored composition for a light-shielding film according to claim 1, wherein at least one of the organic pigments is a diketopyrrolopyrrole-based pigment, a perylene-based pigment, a benzimidazolone-based pigment, a perinone-based pigment, a naphthol AS-based pigment, an anthraquinone-based pigment, a pyrazolone-based pigment, or an isoindolinone-based pigment.

6. The colored composition for a light-shielding film according to claim 1, which is photocurable and further comprises a resin, a polymerizable compound, and a photopolymerization initiator.

7. The colored composition for a light-shielding film according to claim 6, which is used for preparation of a color filter for a solid-state image sensing device.

8. The colored composition for a light-shielding film according to claim 6, wherein the resin is a resin having an acryloyl group or a methacryloyl group.

9. The colored composition for a light-shielding film according to claim 6, wherein the photopolymerization initiator is an oxime-based photopolymerization initiator.

10. A method for forming a light-shielding pattern, comprising:
    providing the colored composition for a light-shielding film of claim 6 on a support to form a colored film;
    exposing the colored film in a pattern shape; and
    developing the colored film after exposure to form a light-shielding pattern.

11. A light-shielding film formed by the method for forming a light-shielding pattern of claim 10.

12. A solid-state image sensing device comprising the light-shielding film of claim 11.

13. A method for producing a solid-state image sensing device, comprising:
    providing the colored composition for a light-shielding film of claim 6 on a light-transmitting member disposed on a light-receiving surface side of a semiconductor substrate provided with at least a color filter and a light-receiving region to form a colored film;
    exposing the formed colored film in a pattern shape;
    developing the colored film after exposure to form a light-shielding pattern; and
    separating the semiconductor substrate after formation of the light-shielding pattern into predetermined element to prepare a solid-state image sensing device.

14. The colored composition for a light-shielding film according to claim 1, wherein the content of total pigments including the black titanium pigment and the organic pigment is from 15 to 60% by mass relative to the total solids content of the colored composition.

15. The colored composition for a light-shielding film according to claim 1, which further comprises a dispersant having an acid value of 50 mgKOH/g or more.

16. The colored composition for a light-shielding film according to claim 1, wherein the at least one organic pigment is at least one selected form the group consisting of C.I. Pigment Red 179, C.I. Pigment Red 224, C.I. Pigment Red 254, C.I. Pigment Violet 29, C.I. Pigment Yellow 139, C.I. Pigment Orange 34, C.I. Pigment Orange 36, C.I. Pigment Orange 38, C.I. Pigment Orange 43, C.I. Pigment Orange 62, C.I. Pigment Orange 64 and C.I. Pigment Orange 71.

17. The colored composition for a light-shielding film according to claim 1, wherein the at least one organic pigment comprises C.I. Pigment Red 254.

18. The colored composition for a light-shielding film according to claim 17, wherein the mass ratio (tip:orp) of the black titanium pigment (tip) and the organic pigment (orp) is from 90:10 to 40:60.

19. A light-shielding film, comprising at least one pigment selected from titanium atom-containing black titanium pigments and at least one organic pigment selected from the group consisting of a red organic pigment, a yellow organic pigment, a violet organic pigment, and an orange color organic pigment;
    wherein, when the transmittance of light having a wavelength of 650 nm of the light-shielding film is 0.2%, the light-shielding film has a maximum value of transmittance of light having a wavelength of 400 to 700 nm of 1.5% or less; has a wavelength exhibiting the maximum value of transmittance in the range of 400 to 550 nm, and has a transmittance of light having a wavelength of 400 nm of 0.1% or more.

20. A solid-state image sensing device comprising the light-shielding film of claim 19.

21. A solid-state image sensing device, comprising:
    a semiconductor substrate including a plurality of light-receiving elements;

an optical member which is disposed facing each light-receiving element and has a light-collecting function for collecting light incident on the light-receiving elements;

a color filter which is disposed between the light-receiving elements and the optical member; and a light-transmitting member which is provided on the side of the optical member not facing the color filter, has a light-shielding pattern in at least a part of the regions other than the region facing the plurality of light-receiving elements, the light-shielding pattern comprising at least one pigment selected from titanium atom-containing black titanium pigments and at least one organic pigment selected from a red organic pigment, a yellow organic pigment, a violet organic pigment, and an orange color organic pigment, wherein, when the transmittance of light having a wavelength of 650 nm of the light-shielding pattern is 0.2%, the light-shielding pattern has a maximum value of transmittance of light having a wavelength of 400 to 700 nm of 1.5% or less, has a wavelength exhibiting the maximum value of transmittance in the range of from 400 to 550 nm, and has a transmittance of light having a wavelength of 400 nm of 0.1% or more.

* * * * *